United States Patent
Nakamura

[11] Patent Number: 6,110,753
[45] Date of Patent: Aug. 29, 2000

[54] SEMICONDUCTOR MEMORY AND MANUFACTURING METHOD OF THE SEMICONDUCTOR MEMORY

[75] Inventor: Ryoichi Nakamura, Tokyo, Japan

[73] Assignee: NEC Corporation, Tokyo, Japan

[21] Appl. No.: 09/428,790

[22] Filed: Oct. 28, 1999

[30] Foreign Application Priority Data

Oct. 29, 1998 [JP] Japan .................. 10-309125

[51] Int. Cl.⁷ .................. H01L 21/66
[52] U.S. Cl. .................. 438/16; 438/239
[58] Field of Search .................. 438/239, 592, 438/624, 970, 381, 397, 16; 257/295

[56] References Cited

U.S. PATENT DOCUMENTS 4,882,289 11/1989 Moriuchi et al. .................. 437/52

*Primary Examiner*—Matthew Smith
*Assistant Examiner*—Calvin Lee
*Attorney, Agent, or Firm*—Sughrue, Mion, Zinn, Macpeak & Seas, PLLC

[57] ABSTRACT

The thickness of the silicon oxide film covering the upper surface of the word lines 111 is thinner than the thickness of the insulation film spacer 127a covering the side of the gate electrode, and in reflection of this phenomenon, the step of the upper surface of the BPSG film 133 becomes smaller than ½ of the depth of focus DOF of the KrF excimer laser and bit lines 137a are formed which have a narrower width and interval than the wavelength of the KrF excimer laser free from the disconnection and the short circuit. As a consequence, bit lines have narrower widths and interval than the wavelength of the exposure light without sacrificing the productivity.

10 Claims, 13 Drawing Sheets

(NA = 0.55, KrF STEPPER DESIGN GOAL PATTERN WIDTH = 0.216 μm)

(DESIGN GOAL PATTERN INTERVAL = 0.252 μm)

SEMICONDUCTOR MEMORY AND MANUFACTURING METHOD OF THE SEMICONDUCTOR MEMORY

BACKGROUND OF THE INVENTION

1. Field of the Invention

The present invention relates to a DRAM and Method for manufacturing the DRAM, and particularly to a structure of an insulation film covering a MOS transistor (which constitutes a peripheral circuit), a cell transistor (which constitutes a memory cell), and a manufacturing method of the insulation film.

2. Description of the Related Art

In a conventional DRAM, a cell transistor comprising an N-channel MOS transistor constituting a memory cell and an N-channel MOS transistor constituting at least a part of a peripheral circuit both have an LDD-type source and drain region comprising an $N^-$-type diffusion layer which is formed in self-alignment with the gate electrode (or word lines) and $N^+$-type diffusion layer which is formed in self-alignment with an insulation spacer covering a side of the gate electrode (or a word line). However, from the time of the emergence of a 64 MB-type DRAM which adopts 0.35 $\mu$m design rule, an $N^-$-type source and drain region which comprises only an $N^-$-type diffusion layer which is self-aligned with respect to the word lines has come to be adopted in the cell transistor.

Reasons for the adoption of the $N^-$-type source and drain region in the cell transistor can be explained as follows. An etch-back is performed with respect to an insulation film in the formation of the insulation film spacer on the side of the word lines. However, because of the damage caused by the etch-back, the deterioration of the holding characteristic becomes conspicuous in the cell transistors that are made fine by the use of a manufacturing method using a design rule on the order of 0.35 $\mu$m. On the other hand, although the holding characteristic required of the N-channel MOS transistor constituting the peripheral circuit is not based on such a strict value, a drive current having a high value is required with the result that it is preferable to adopt the LDD-type source and drain region in this transistor as has been carried out in a conventional manner.

By referring to FIGS. 1A through 1D showing sectional model views illustrating steps of manufacturing a DRAM and FIGS. 2A and 2B showing plan model views of the DRAM and a sectional model view thereof and, thus giving an example of a DRAM in which the peripheral circuit such as a decoder circuit, a sense amplifier circuit or the like connected to word lines and bit lines of a memory cell, a manufacturing method of the DRAM will be explained in the case where 0.25 $\mu$m (quarter micron) design rule is adopted. Incidentally, FIGS. 1A through 1D are sectional model views of the manufacturing steps at a position corresponding to line A—A of FIG. 2A. FIG. 2B is a sectional model view taken along line A—A of FIG. 2A.

This DRAM is provided on the surface of a P-type silicon substrate 201. A cell array region 251 on which a DRAM memory cell is arranged, a boundary region 252 surrounding this cell array region 251, and a peripheral circuit region 253 on which a peripheral circuit is formed are provided on the surface of the P-type silicon substrate 201. This DRAM is formed in the following manner.

In the beginning, on a device separation region of the cell array region 251 and the peripheral circuit region 253 including the boundary region 252 on the surface of the P-type silicon substrate 201, a groove having a depth of, for example, about 300 nm is formed by an anisotropic etching process. In this groove, a field insulation film 202 is filled by means of the CVD or the like. Preferably, an upper surface of the field insulation film 202 is generally flush with the surface of the P-type silicon substrate 201. On the device formation regions 203 and 204 on the surface of the P-type silicon substrate 201 surrounded by the device separation region, a gate insulation film 205 having a thickness of, for example, about 5 nm is formed. A minimum width of (the field insulation film 202 in) the boundary region 252 is, for example, about 1.2 $\mu$m.

Subsequently, on an overall surface of the silicon substrate 201, an $N^+$-type polycrystal silicon film having a thickness of, for example, about 100 nm and a tungsten silicide film having a thickness, for example, about 100 nm are formed. This tungsten silicide film and the $N^+$-type polycrystal silicon film are patterned one after another by the anisotropic etching process. On the cell array region 251 and the peripheral circuit region 253, word lines 211 and a gate electrode 212 are formed respectively which are formed by the lamination of the tungsten silicide film pattern 242 on the $N^+$-type polycrystal silicon film pattern 241. The line width (gate width) of the word lines 211 and the gate electrode 212 are about 0.3 $\mu$m and about 0.5 $\mu$m respectively. The interval between adjacent word lines 211 and the interval between the word lines 211 and the field insulation film 202 are, for example, about 0.6 $\mu$m respectively.

Subsequently, by means of ion implantation or the like using as a mask the field insulation film 202, the word lines 211, and the gate electrode 212, an $N^-$-type source and drain region 214 having a junction depth of, for example, about 70 nm and an $N^-$-type diffusion layer 215 are formed respectively on the device formation region 203 and the device formation region 204 on the surface of the P-type silicon substrate 201. As a consequence, a memory cell comprising a gate insulation film 205, word lines 211, the $N^-$-type source and drain region 214 is completed. Here, (generally), one of the $N^-$-type source and drain region 214 belongs to one of the word lines 211 (one memory cell) while the other of the $N^-$-type source and drain region 214 is shared by two adjacent word lines 211 (two memory cells). The minimum interval between the gate electrode 212 and the field insulation film 202 is, for example, about 1.0 $\mu$m (see FIG. 1A and FIG. 2A).

Next, a first silicon oxide film 221 having a thickness of, for example, about 130 nm is formed on the overall surface of the substrate 201 by means of a low-pressure chemical vapor deposition process (LPCVD). By means of an anisotropic etching process with a photoresist film pattern 244 covering the cell array region 251 and the boundary region 252, this silicon oxide film 221 (and the gate insulation film 205) is selectively etched back with the result that an insulation film spacer 227 (comprising the silicon oxide film 221) covering the side of the gate electrode 212 is retained and formed. The thickness of the insulation film spacer 227 is generally about 130 nm (see FIG. 1B).

By means of the ion implantation of arsenic before and after the removal of the photoresist film pattern 244 and by means of the heat treatment after the removal of the photoresist film, an $N^+$-type diffusion layer 229 is formed on the device formation region 204 in self-alignment with the field insulation film 202 and the insulation film spacer 227 (together with the gate electrode 212). The depth of the junction of the $N^+$-type diffusion layer 229 is, for example, about 200 nm. As a consequence, the N-channel MOS transistor that constitutes the peripheral circuit is completed.

The source and drain region of the N-channel MOS transistor comprises an LDD type source and drain region 230 which comprises the N+-type diffusion layer 229 and the N−-type diffusion layer 215. The thickness of the silicon oxide film 221 (insulation film spacer 227) is regulated with the depth of the N+-type diffusion layer 229.

Subsequently, by means of an atmospheric pressure chemical vapor deposition (APCVD) process, a second silicon oxide film 231 having a thickness of, for example, about 100 nm is formed on the overall surface of the substrate 201. Furthermore, by means of the APCVD using as a material ozone ($O_3$), TEOS ($Si(OC_2H_5)_4$), TMOP ($PO(OCH_3)_3$), and TMB ($B(OCH_3)_3$), a BPSG film 232 having a thickness of, for example, about 200 nm is formed. Here, the reason why the APCVD process is adopted for the formation of the silicon oxide film 231, and the BPSG film 232 is that the priority is given to the productivity. The concentration of the phosphorus in the BPSG film 232 is, for example, 4.8 mol %. The concentration of boron is, for example, 10.3 mol %. At this time, the highest position on the upper surface of the BPSG film 232 is a part immediately on the word lines 211. The lowest position of the upper surface thereof is a portion immediately on the field insulation film 202 adjacent to the boundary region 252 (in the peripheral circuit region 253), and the LDD type source and drain region 230. The maximum step on the upper surface of the BPSG film 232 is about 330 nm. This value is equal to the sum of the thickness of the word lines 211 and the thickness of the first silicon oxide film 221 (see FIG. 1C and FIG. 2B).

Next, the heat treatment is carried out in the atmosphere of nitrogen, for example, at 850° C. for about 10 minutes. The BPSG film 232 is reflowed and the BPSG film 233 is formed. With this reflow, the largest step on the upper surface of the BPSG film 233 is decreased to about 270 nm (see FIG. 1D).

Incidentally, on the BPSG film 232 having the thickness described above and the phosphorus concentration described above, even when the condition of the reflow is changed to, for example, a higher temperature, or a longer time, the decrease in the maximum step of the upper surface described above does not change so much. When the concentration of phosphorus is increased to a level more than the level described above, a deposition of phosphorus is generated with the result that a moisture endurance is lowered. The thickness of the BPSG film 232 is demanded by to maintain the productivity, the suppression of the overhang configuration of the BPSG film deriving from the APCVD and the suppression of the an increase in the aspect ratio of the contact hole which is formed on the interlayer insulation film (which is formed by the lamination of the BPSG film 233 on the second silicon oxide film 231). Furthermore, in the case where the thickness of the BPSG film 232 is thin in this manner, the planarization by the CMP is not favorable.

Next, a chemical amplification type and positive type photoresist film (not shown) is formed on the surface of the BPSG film 233. In agreement with the upper surface of this photoresist film in focus immediately on the word lines 211, (under the condition that an open pattern width becomes minimum at this position), an open pattern is formed on this photoresist film by means of stepper exposure using a KrF excimer laser. The anisotropic etching process is carried out with respect to the silicon oxide film using as a mask this photoresist film pattern with the result that a bit contact hole 235 which reaches the N−-type source and drain region 214 and a contact hole 236 which reaches a LDD type source and drain region 230 are formed. The bit contact hole 235 has a size on the order of 0.25 μm square while the contact hole 236 has a size on the order of 0.3 μm square. In the exposure described above, the reason why the open pattern width at the position described above is set to a minimum level and is prevented from becoming a maximum is that, for example, the contact hole 236 is securely formed.

After a conductive film is formed on the overall surface of the substrate, the chemical amplification type and positive type photoresist film (not shown) which covers the surface of this conductive film is formed. By focusing on the upper surface of the photoresist film immediately on the word lines 211, (under the condition that the pattern width becomes maximum at this position), the photoresist film pattern is formed by means of the stepper exposure using the KrF excimer laser. At this time, the design target width of the photoresist film pattern and the design goal minimum interval thereof are 0.216 μm and 0.252 μm respectively. The exposure light amount of the KrF excimer laser for this purpose is about 40 mJ. Subsequently, by using as a mask the photoresist film pattern, this conductive film is subjected to the anisotropic etching process with the result that bit line 237 and wiring 238 is formed. The bit line 237 is connected to a plurality of cell transistors via the bit contact holes 235 and are connected to at least one of the N-channel MOS transistors constituting the peripheral circuit via the contact holes 236. The bit lines 237 are used for the connection between the N-channel MOS transistors or the like constituting the peripheral circuit via the contact holes 236. The bit lines 236 vertically intersect the word lines 211 via the first silicon oxide film 221 and the interlayer insulation film comprising the BPSG film 233 and the second silicon oxide film 231 (see FIG. 2A and FIG. 2B).

Incidentally, in the exposure described above for the formation of the photoresist film for patterning the bit lines 237 and the wiring 238, the reason why the photoresist film pattern width at the position described above is set to the maximum is to avoid the short circuit of adjacent bit lines. The line width of the bit lines 237 at the portion of the bit contact holes 235 is about 0.5 μm with the result that the interval between the bit lines 237 at the portion where the bit contact holes 235 lie adjacent to each other becomes minimum. Consequently, it is essential that the short circuit between the bit lines 237 at the portion where the bit contact holes 235 lie adjacent to each other is completely avoided.

After that (though not shown), a second interlayer insulation film is formed on the overall surface of the substrate. After a node contact hole is formed which reaches the other of the N−-type source and drain region 214 through the BPSG film 233, the first and second silicon oxide films 221, 231 (and the gate insulation film 205), a storage node electrode is formed which is connected to the cell transistors via the node contact hole. Furthermore, a capacity insulation film, a cell plate electrode or the like are formed with the result that the DRAM is completed.

However, in the DRAM described above by referring to FIGS. 1A through 1D, FIG. 2A and FIG. 2B, there arises a disadvantage that the line width of the bit lines 237 in the peripheral circuit region 253 (particularly, in a portion located in the vicinity of the boundary region 252) becomes thinner than the line width in the cell array region 251 with the result that the bit lines are disconnected at this portion.

The wavelength λ of the KrF excimer laser used in the exposure of the formation of the photoresist film pattern for the patterning of the bit lines 237 and the wiring 238 is 248 nm. The depth of focus (DOF) at the time of the exposure at 40 mJ is about 0.4 μm. However, since the focus position is determined under the conditions described above, DOF/2= 0.2 μm comes to have an effective meaning. Consequently, in the case where the maximum step of the upper surface of the BPSG film 233 is larger than DOF/2=0.2 μm, there is generated a portion where the photoresist film pattern is not formed. The maximum step of the upper surface of the BPSG film 233 is associated with the maximum step of the upper surface of the BPSG film 232. The maximum step of the upper surface of the BPSG film 232 is regulated by the sum of the thickness of the word lines 211 and the thickness of the first silicon oxide film 221. The sum is larger than the value of λ. At the time of making fine the cell transistors, it is difficult to set the thickness of the word lines 211 in proportion to the reduction ratio.

When only the avoidance of the disconnection of the bit lines 237 is noted, only the exposure light amount may be reduced to about 36 mJ because the maximum step of the upper surface of the BPSG film 233 is about 270 nm. However, when such exposure light amount is reduced, the interval of the photoresist film patterns becomes narrow with the result that a short circuit is generated between the bit lines 237.

SUMMARY OF THE INVENTION

An object of the present invention is to provide a structure of an insulation film (covering a cell transistor or the like) and a manufacturing method of such an insulation film, the structure thereof being capable of avoiding the short circuit and the disconnection of the bit lines without sacrificing the productivity.

According to a first aspect of the present invention, there is provided a semiconductor memory given as a DRAM in which:

a cell array region, a boundary region and a peripheral circuit region are provided adjacent to each other in a P-type region provided on the surface of a silicon substrate;

a device separation region of the cell array region, the boundary region, and the peripheral circuit region comprises grooves provided on the surface of the P-type region, and a field insulation film the upper surface of which is generally flush with the surface of the silicon substrate, the film filling the grooves;

a plurality of N-channel MOS transistors and a plurality of cell transistors constituting memory cells are provided in the peripheral circuit region and the cell array region;

the plurality of cell transistors and the N-channel MOS transistors comprise respectively a gate insulation film, word lines and a gate electrode having a first thickness (=t1), an $N^{31}$ -type source and drain region comprising an $N^-$-type diffusion layer and an LDD-type source and drain region comprising an $N^+$-type diffusion layer and an $N^-$-type diffusion layer;

the memory cell region and the boundary region including the cell transistors are covered by the first silicon oxide film;

only the side of the gate electrode of the N-channel MOS transistors is covered with an insulation film spacer which is obtained by the etch-back of a first silicon oxide film and which has a second thickness (=t2);

the peripheral circuit region including the first silicon oxide film and the N-channel MOS transistors is covered with an interlayer insulation film comprising a lamination of a second silicon oxide film and a BPSG film which is formed by means of the atmospheric pressure chemical vapor deposition (APCVD) process and which is further reflowed;

a first contact hole (a bit contact hole) which reaches one of the $N^-$-type source and drain regions and a second contact hole which reaches the N-channel MOS transistors are provided respectively on the interlayer insulation film;

bit lines connected to the plurality of cell transistors via the bit contact holes and connected to at least one of the N-channel MOS transistors via the second contact holes and a wiring connected to the plurality of these N-channel MOS transistors via these second contact holes are provided on the surface of the interlayer insulation film; and an accumulation capacity element connected to the other of the $N^-$-type source and drain region is provided on an upper position than the bit lines.

The first silicon oxide film at a portion covering the upper surface of the word lines has a third thickness (=t3) which is thinner than t2. The line width of the bit lines excluding the vicinity of the bit contact holes and the minimum interval of these bit lines are shorter than the wavelength (=λ) of the exposure light which is used for the photolithography in the formation of the bit lines and the wiring respectively. t1+t3 is larger than ½ of the depth of focus (=DOF) in the photolithography. The maximum step of the upper surface of the interlayer insulation film is further smaller than DOF/2 and larger than DOF/2−(t2−t3).

According to a second aspect of the present invention, there is provided a semiconductor memory given as a DRAM in which;

a cell array region, a boundary region and a peripheral circuit region are provided adjacent to each other in a P-type region provided on the surface of a silicon substrate;

a device separation region of the cell array region, the boundary region and the peripheral circuit region comprises grooves provided on the surface of the P-type region, and a field insulation film the upper surface of which is generally flush with the surface of the silicon substrate, the film filling the grooves;

a plurality of N-channel MOS transistors and a plurality of cell transistors constituting memory cells are provided respectively in the peripheral circuit region and the cell array region;

the plurality of cell transistors and the N-channel MOS transistors comprise respectively a gate insulation film, word lines and a gate electrode having a first thickness (=t1), an $N^-$-type source and drain region comprising an $N^-$-type diffusion layer and an LDD-type source and drain region comprising an $N^+$-type diffusion layer and an $N^-$-type diffusion layer;

the field insulation film in the cell array region, the surface of the cell transistors and the boundary region are directly covered with the first silicon oxide film having the second thickness (=t2);

the side of the word lines is further covered with a silicon nitride film spacer formed by the etch-back of a silicon nitride film having a third thickness (=t3) via the first silicon oxide film;

only the side of the gate electrode of the N-channel MOS transistor is still further covered with an insulation spacer formed by the etch-back of the first silicon oxide film and the silicon nitride film;

the peripheral circuit region including the first silicon oxide film, the silicon nitride film spacer and the N-channel MOS transistor is covered with an interlayer insulation film comprising a lamination of the second silicon oxide film and a BPSG film which is formed by means of the APCVD and which is further reflowed;

a first contact hole (a bit contact hole) which reaches one of the N⁻-type source and drain regions and a second contact hole which reaches the N-channel MOS transistors are provided respectively on the interlayer insulation film;

bit lines connected to the plurality of cell transistors via the bit contact hole and connected to at least one of the N-channel MOS transistors via the second contact holes and a wiring connected to the plurality of these N-channel MOS transistors via these second contact holes are provided on the surface of the interlayer insulation film; and an accumulation capacity element connected to the other of the N⁻-type source and drain region is provided on an upper position than the bit lines.

The line width of the bit lines excluding the vicinity of the bit contact hole and the minimum interval of these bit lines are shorter than the wavelength (λ) of the exposure light which is used for the photolithography in the formation of the bit lines and the wiring respectively. t1+t2 is larger than ½ of the depth of focus (=DOF) in the photolithography for regulating the line width and the minimum interval of the bit lines. The maximum step of the upper surface of the interlayer insulation film is further smaller than DOF/2 and larger than DOF/2−t3).

A third aspect of the present invention provides a semiconductor memory given as a DRAM in which:

a cell array region, a boundary region and a peripheral circuit region are provided adjacent to each other in a P-type region provided on the surface of a silicon substrate;

a device separation region of the cell array region, the boundary region, and the peripheral circuit region comprises grooves provided on the surface of the P-type region, and a field insulation film the upper surface of which is generally flush with the surface of the silicon substrate, the film filling the grooves;

a plurality of N-channel MOS transistors and a plurality of cell transistors constituting memory cells are provided respectively in the peripheral circuit region and the cell array region;

the plurality of cell transistors and the N-channel MOS transistors comprise respectively a gate insulation film, word lines and a gate electrode having a first thickness (=t1), an N⁻-type source and drain region comprising an N⁻-type diffusion layer and an LDD-type source and drain region comprising an N⁺-type diffusion layer and an N⁻-type diffusion layer;

the field insulation film of the cell array region, the surface of the cell transistor and the boundary region are directly covered with a first silicon oxide film and a lamination layer insulation film formed of the first silicon oxide film and a silicon nitride film having a thickness which is sufficiently thinner than the first silicon oxide film, the lamination layer having a second thickness (=t2);

the side of the word lines is further covered with a silicon oxide film spacer formed by the etch-back of the second silicon oxide film having a third thickness (=t3) via the lamination layer insulation film;

only the side of the gate electrode of the N-channel MOS transistor is still further covered with the first silicon oxide film and an insulation film spacer formed by the etch-back of the second silicon oxide film;

the peripheral circuit region including the first silicon oxide film, the silicon nitride film spacer and the N-channel MOS transistor is covered with an interlayer insulation film formed by a lamination of the third silicon oxide film and a BPSG film which is formed by means of the APCVD and which is further reflowed;

a first contact hole (a bit contact hole) which reaches one of the N⁻-type source and drain region and the N-channel MOS transistors of the source and drain region and a second contact hole are provided respectively on the interlayer insulation film;

bit lines connected to the plurality of cell transistors via the bit contact holes and connected to at least one of the N-channel MOS transistors via the second contact holes and a wiring connected to the plurality of these N-channel MOS transistors via these second contact holes are provided on the surface of the interlayer insulation film; and an accumulation capacity element connected to the other of the N⁻-type source and drain region is provided on an upper position than the bit lines.

The line width of the bit lines excluding the vicinity of the bit contact holes and the minimum interval of these bit lines are shorter than the wavelength (=λ) of the exposure light which is used for the photolithography in the formation of the bit lines and the wiring respectively. t1+t3 is larger than ½ of the depth of focus (=DOF) in the photolithography. The maximum step of the upper surface of the interlayer insulation film is smaller than DOF/2 and larger than DOF/2−(t2−t3).

A manufacturing method of the semiconductor memory according to the first aspect of the present invention is a manufacturing method of a DRAM in which: bit lines are formed by the photolithography of the exposure light having the wavelength of λ, and the depth of focus of DOF, and the line width of the bit lines excluding the connection portion with the cell transistors and the minimum interval of the bit lines becomes shorter than λ respectively in the bit lines, and an accumulation capacity element connected to the other of the N⁻-type source and drain region is further provided on an upper position than the bit lines.

The method comprises the steps of:

forming a P-type region on the surface of the silicon substrate, forming grooves in a cell array region, a peripheral circuit region and a device separation region of a boundary region between the cell array region and the peripheral circuit region, and filling in these grooves a field insulation film the upper surface of which is generally flush with the surface of the silicon substrate;

forming a gate insulation film by means of heat oxidation on the surface of the silicon substrate in the cell array region and the peripheral circuit region surrounded by the device separation region, forming a first conductive film having a first thickness (=t1) on an overall surface of the silicon substrate and forming word lines and a gate electrode on the surface of the P-type region of this cell array region and the peripheral circuit region by the patterning of this first conductive film;

forming an N⁻-type source and drain region and an N⁻-type diffusion layer on the surface of the P-type region of the cell array region and the peripheral circuit region surrounded by the device separation region in self-alignment with the word lines and the gate electrode;

forming a first silicon oxide film having a second thickness (=t2) which is thicker than the DOF/2−t1 on the overall surface of the silicon substrate by means of the low pressure chemical vapor deposition (LPCVD) process;

etching back the first silicon oxide film by the anisotropic dry etching process to set the thickness of the first silicon oxide film immediately on the word lines and the gate electrode to a third thickness (=t3);

etching back again the first silicon oxide film again by means of the anisotropic dry etching process by using as a mask a first photoresist film pattern which covers the cell array region and the boundary region and which has an opening in the peripheral circuit region to retain and form an insulation film spacer comprising the first silicon oxide film on the side of the gate electrode;

forming an $N^+$-type diffusion layer on the surface of the P-type region of the peripheral circuit region by using as a mask the gate electrode and the insulation film spacer and forming an LDD-type source and drain region comprising an $N^+$-type diffusion layer and an $N^-$-type diffusion layer;

forming a second silicon oxide film on an overall surface of the substrate and forming a BPSG film on the overall surface of the silicon substrate by means of the APCVD and reflowing the BPSG film so that the maximum step of the upper surface of the BPSG film becomes smaller than t1+t3 and DOF/2 and larger than DOF/2−(t2−t3) thereby forming an interlayer insulation film comprising the second silicon oxide film and the BPSG film;

forming on the interlayer insulation film bit contact holes and contact holes which reach respectively one of the N-type source and drain region and one of the LDD-type source and drain region;

forming a second conductive film on an overall surface of the silicon substrate, forming a positive-type photoresist film on the overall surface of the substrate, forming a second photoresist film pattern by focusing the upper surface of the photoresist film immediately on the word lines and further performing exposure under the condition that the pattern width in this portion becomes maximum, forming bit lines by means of the anisotropic dry etching process using as a mask these photoresist film patterns, and simultaneously forming a wiring on the peripheral circuit region; and forming a second interlayer insulation film on the overall surface of the substrate, forming a node contact hole which reaches the other of the $N^-$-type source and drain region through the second interlayer insulation film and the first interlayer insulation film and forming an accumulation capacity element connected to the other of the $N^-$-type source and drain region via the node contact holes.

In the manufacturing method of the first semiconductor memory according to the present invention, preferably, the second photoresist film pattern is formed of the chemical amplification type photoresist film, and these second photoresist film patterns are formed by means of the exposure using the KrF excimer laser or the exposure using the ArF excimer laser.

The manufacturing method of the second semiconductor memory according the present invention is a manufacturing method of a DRAM in which: bit lines are formed by the photolithography of the exposure light having the wavelength of $\lambda$, and the depth of focus of DOF, and the line width of the bit lines excluding the connection portion with the cell transistors and the minimum interval of the bit lines becomes shorter than $\lambda$ respectively in the bit lines, and an accumulation capacity element connected to the other of the $N^-$-type source and drain region is further provided on an upper position than the bit lines.

The method comprises the steps of:

forming a P-type region on the surface of the silicon substrate, forming grooves in the cell array region, the peripheral circuit region and a device separation region of the boundary region between the cell array region and the peripheral circuit region, and filling in the grooves a field insulation film the upper surface of which is generally flush with the surface of the silicon substrate;

forming a gate insulation film by heat oxidation on the surface of the silicon substrate in the cell array region and the peripheral circuit region surrounded by the device separation region, forming the first conductive film having the first thickness (=t1) on the overall surface of the substrate, and forming the word lines and the gate electrode on the surface of the P-type region on the cell array region and the peripheral circuit region by the patterning of the first conductive film;

forming an $N^-$-type source and drain region and an $N^-$-type diffusion layer on the surface of the P-type region of the cell array region and the peripheral circuit region surrounded by the device separation region in self-alignment with the word lines and the gate electrode;

forming the first silicon oxide film having a second thickness which is thicker than DOF/2−t1 by means of the low pressure chemical vapor deposition;

etching back the first silicon oxide film by the anisotropic dry etching to set the thickness of the first silicon oxide film immediately on the word lines and the gate electrode to a third thickness (=t3);

forming the first photoresist film pattern and etching back again the first silicon oxide film again by means of anisotropic dry etching by using as a mask the first photoresist film pattern which covers the cell array region and the boundary region and which has an opening in the peripheral circuit region to retain and form an insulation film spacer comprising the first silicon oxide film on the side of the gate electrode;

forming an $N^+$-type diffusion layer on the surface of the P-type region of the peripheral circuit region by using as a mask the gate electrode and the insulation film spacer and forming an LDD-type source and drain region comprising an $N^+$-type diffusion layer and an $N^-$-type diffusion layer;

forming a second silicon oxide film on an overall surface of the substrate and forming a BPSG film on the overall surface of the silicon substrate by means of the APCVD and reflowing the BPSG film so that the maximum step of the upper surface of the BPSG film becomes smaller than t1+t2−t3 and DOF/2 and larger than DOF/2−t3 thereby forming an interlayer insulation film comprising the second silicon oxide film and the BPSG film;

forming on the interlayer insulation film bit contact holes and contact holes which reach respectively one of the N-type source and drain region and one of the LDD-type source and drain region;

forming a second conductive film on an overall surface of the silicon substrate, forming a positive-type photoresist film on the overall surface of the substrate, forming a second photoresist film pattern by focusing the upper surface of the photoresist film immediately on the word lines and performing exposure under the condition that the pattern width in this portion becomes maximum, and forming bit lines by means of the anisotropic dry etching using as a mask these photoresist film patterns; and simultaneously forming a wiring on the peripheral circuit region; and forming a second interlayer insulation film on the overall surface of the substrate, forming a node contact hole which reaches the other of the N$^-$-type source and drain region through the second interlayer insulation film and the first interlayer insulation film and forming an accumulation capacity element connected to the other of the N$^-$-type source and drain region via the node contact holes.

In the manufacturing method of the second semiconductor memory according to the present invention, preferably, the second photoresist film pattern is formed of the chemical amplification type photoresist film, and the second photoresist film patterns are formed by means of the exposure using the KrF excimer laser or the exposure using the ArF excimer laser.

The manufacturing method of the third semiconductor memory is a manufacturing method of a DRAM in which: bit lines are formed by the photolithography of the exposure light having the wavelength of $\lambda$, and the depth of focus of DOF, and the line width of the bit lines excluding the connection portion with the cell transistors and the minimum interval of the bit lines becomes shorter than $\lambda$ respectively in the bit lines, and an accumulation capacity element connected to the other of the N$^-$-type source and drain region is further provided on an upper position than the bit lines.

The method compres the steps of:

forming a P-type region on the surface of the silicon substrate, forming grooves in the cell array region, the peripheral circuit region and a device separation region of the boundary region between the cell array region and the peripheral circuit region, and filling in the grooves a field insulation film the upper surface of which is generally flush with the surface of the silicon substrate;

forming a gate insulation film by heat oxidation on the surface of the silicon substrate in the cell array region and the peripheral circuit region surrounded by the device separation region, forming the first conductive film having the first thickness (=t1) on the overall surface of the substrate, and forming the word lines and the gate electrode on the surface of the P-type region on the cell array region and the peripheral circuit region by the patterning of the first conductive film;

forming an N$^-$-type source and drain region and an N$^-$-type diffusion layer on the surface of the P-type region of the cell array region and the peripheral circuit region surrounded by the device separation region in self-alignment with the word lines and the gate electrode;

forming the first silicon oxide film having a second thickness (=t2) and a silicon nitride film having a third thickness (=t3) subsequently on an overall surface of the silicon substrate by the LPCVD under the condition of t1+t2+t3>DOF/2;

selectively etching the silicon nitride film by means of anisotropic dry etching process to form a silicon nitride film spacer which covers the word lines and the side of the gate electrode respectively via the first silicon oxide film;

etching back the silicon nitride spacer and the first silicon oxide film using as a mask the first photoresist film pattern which covers the cell array region and the boundary region and which has an opening in the peripheral circuit region by the anisotropic dry etching process in which the etching rates with respect to the silicon oxide film and the silicon nitride film are generally equal thereby retaining and forming on the side of the gate electrode an insulation film spacer formed by a lamination of the silicon nitride film spacer on the first silicon oxide film;

forming an N$^+$-type diffusion layer on the surface of the P-type region of the peripheral circuit region by using as a mask the gate electrode and the insulation film spacer, and forming an LDD-type source and drain region comprising the N$^+$-type diffusion layer and the N$^-$-type diffusion layer;

forming a second silicon oxide film on an overall surface of the substrate and forming a BPSG film on the overall surface of the silicon substrate by means of the APCVD and reflowing the BPSG film so that the maximum step of the upper surface of the BPSG film becomes smaller than t1+t2 and DOF/2 and larger than DOF/2−t3 thereby forming an interlayer insulation film comprising the second silicon oxide film and the BPSG film;

forming on the interlayer insulation film a bit contact hole and a contact hole which reach respectively one of the N-type source and drain region and one of the LDD-type source and drain region;

forming a second conductive film on an overall surface of the silicon substrate, forming a positive-type photoresist film on the overall surface of the substrate, forming a second photoresist film pattern by focusing the upper surface of the photoresist film immediately on the word lines and performing exposure under the condition that the pattern width in this portion becomes maximum, and forming bit lines by means of the anisotropic dry etching process using as a mask these photoresist film patterns; and simultaneously forming a wiring on the peripheral circuit region; and forming a second interlayer insulation film on the overall surface of the substrate, forming a node contact hole which reaches the other of the N$^-$-type source and drain region through the second interlayer insulation film and the first interlayer insulation film and forming an accumulation capacity element connected to the other of the N$^-$-type source and drain region via the node contact hole.

In the manufacturing method of the third semiconductor memory according to the present invention, preferably, the second photoresist pattern is formed of the chemical amplification type photoresist film, the second photoresist pattern is formed by means of the exposure using the KrF excimer laser or the exposure using ArF excimer laser, and the anisotropic dry etching process for the formation of the insulation film spacer is carried out with tetrafluoromethane (CF$_4$).

The manufacturing method of the fourth semiconductor according to the present invention is a manufacturing method of a DRAM in which: bit lines are formed by the photolithography of the exposure light having the wavelength of $\lambda$, and the depth of focus of DOF, and the line width of the bit lines excluding the connection portion with the cell transistors and the minimum interval of the bit lines becomes shorter than λ respectively in the bit lines, and an accumulation capacity element connected to the other of the N⁻-type source and drain region is further provided on an upper position than the bit lines.

The method compres the steps of:

forming a P-type region on the surface of the silicon substrate, forming grooves in the cell array region, the peripheral circuit region and a device separation region of the boundary region between the cell array region and the peripheral circuit region, and filling in the grooves a field insulation film the upper surface of which is generally flush with the surface of the silicon substrate;

forming a gate insulation film by heat oxidation on the surface of the silicon substrate in the cell array region and the peripheral circuit region surrounded by the device separation region, forming the first conductive film having the first thickness (=t1) on the overall surface of the substrate, and forming the word lines and the gate electrode on the surface of the P-type region on the cell array region and the peripheral circuit region by the patterning of the first conductive film;

forming an N⁻-type source and drain region and an N⁻-type diffusion layer on the surface of the P-type region of the cell array region and the peripheral circuit region surrounded by the device separation region in self-alignment with the word lines and the gate electrode;

forming a first silicon oxide film having a second thickness (=t2) and a silicon nitride film which is sufficiently thinner than the first silicon oxide film subsequently on the overall surface of the substrate by the LPCVD;

selectively removing the silicon nitride film by the isotropic dry etching process by using as a mask the first photoresist film pattern which covers the cell array region and the boundary region and which has an opening in the peripheral circuit region;

forming a second silicon oxide film having a third thickness (=t3) on the overall surface of the substrate by means of the LPCVD under the condition of t1+t2+t3>DOF/2;

retaining and forming on the side of the word lines a silicon oxide film spacer comprising the second silicon oxide film and retaining and forming on the side of the gate electrode an insulation film spacer comprising a lamination of the second silicon oxide film on the first silicon oxide film by the etch-back using the anisotropic dry etching process for selectively etching the silicon oxide film;

forming an N⁺-type diffusion layer on the surface of the P-type region of the peripheral circuit region by using as a mask the gate electrode and the insulation film spacer, and forming an LDD-type source and drain region comprising the N⁺-type diffusion layer and the N⁻-type diffusion layer;

forming a third silicon oxide film on the overall surface of the substrate, further forming a BPSG film on the overall surface of the substrate by means of the APCVD and reflowing the BPSG film so that the maximum step of the upper surface of the BPSG film becomes smaller than t1+t2 and DOF/2 and larger than DOF/2–t3 thereby forming an interlayer insulation film comprising the second silicon oxide film and the BPSG film;

forming a bit contact hole and a contact hole which reaches one of the N-type source and drain region and one of the LDD-type source and drain region on the interlayer insulation film;

forming a second conductive film on an overall surface, forming a positive-type photoresist film on the overall surface of the substrate, forming a second photoresist film pattern by focusing the upper surface of the photoresist film immediately on the word lines and carrying out exposure under the condition that the pattern width at this portion becomes maximum and bit lines are formed by means of the anisotropic dry etching using as a mask the photoresist film patterns and simultaneously forming a wiring on the peripheral circuit region; and forming a second interlayer insulation film on the overall surface of the substrate, forming a node contact hole which reaches the other of the N⁻-type source and drain region through the second interlayer insulation film and the first interlayer insulation film and forming an accumulation capacity element connected to the other of the N⁻-type source and drain region via the node contact hole.

In the manufacturing method of the fourth semiconductor memory according to the present invention, preferably, the second photoresist pattern is formed of the chemical amplification type photoresist film, the second photoresist film pattern is formed by means of the exposure using the KrF excimer laser or the exposure using the ArK excimer laser. Furthermore, a selective isotropic dry etching process with respect to the silicon nitride film is carried out with the sulphur hexafluoride ($SF_6$).

DESCRIPTION OF THE PREFERRED EMBODIMENTS

Preferred embodiments of the present invention will be specifically explained by referring to the accompanying drawings.

A DRAM of the present invention is formed on a P-type silicon substrate. A structure of this P-type silicon substrate is constituted in the following manner. On the surface of the P-type silicon substrate, a deep N-well is formed which has a deep junction depth, and a P-well is provided on the surface of the deep N-well. Furthermore, on the surface of the P-type silicon substrate that is separated from the deep N-well, the N-type well is provided. In the DRAM according to the present invention, a cell array region on which the cell transistor is formed and a part of the peripheral circuit region are provided on the P-well while a residual portion of the peripheral circuit region is provided on the surface excluding the deep P well, (on the surface including the N-well). The source and drain region of the cell transistor are constituted only of the $N^-$-type diffusion layer. The N-channel MOS transistor (which is directly formed on the P-well and on the surface of the P-type silicon substrate) constituting the peripheral circuit has an LDD-type source and drain region comprising an $N^+$-type diffusion layer and an $N^-$-type diffusion layer. The P-channel MOS transistor (which is formed on the N-well) constituting the peripheral circuit has a LDD-type source and drain region.

Next, a first embodiment of the present invention will be explained. In the DRAM according to a first embodiment of the present invention, the upper surface and the side of the word lines which constitute the gate electrode of the cell transistors are directly covered with the first silicon oxide film while the side of the gate electrode of the MOS transistor constituting the peripheral circuit is directly covered with the insulation film spacer comprising the first silicon oxide film. At this time, the thickness of the first silicon oxide film becomes thinner than the thickness of the insulation film spacer at a portion where the upper surface and the side of the word lines are covered.

Figure 1A:
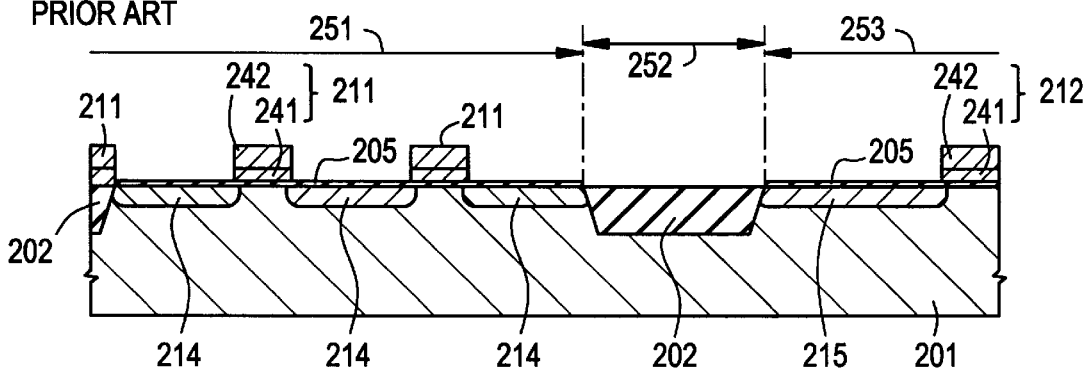
FIGS. 1A through 1D are sectional model views showing steps in the manufacture of a conventional DRAM.
Figure 1B:
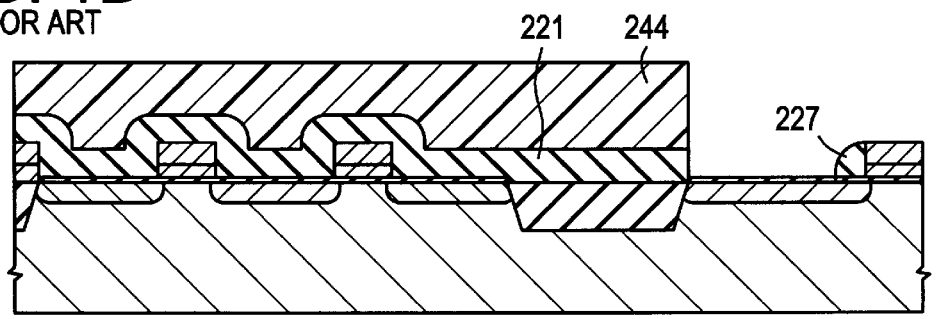
Figure 1C:
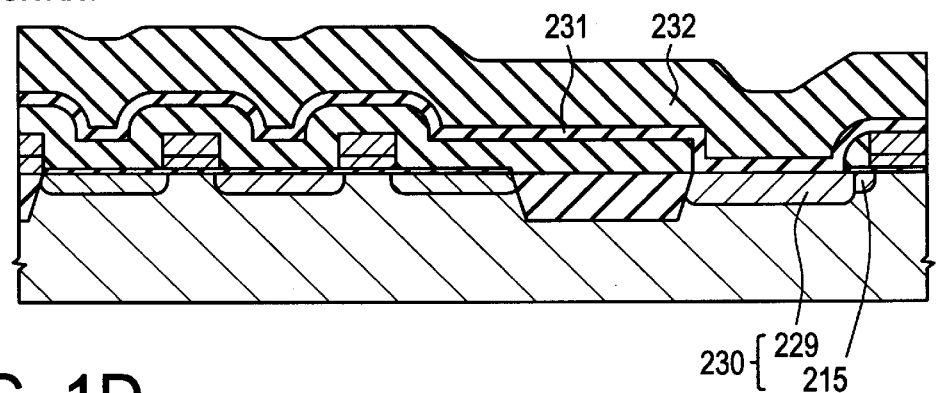
Figure 1D:
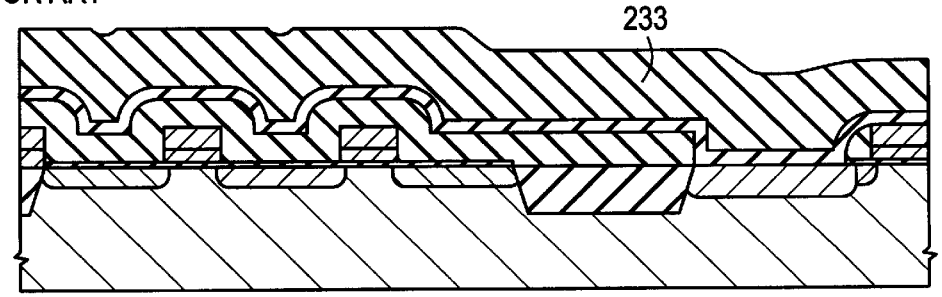
Figure 2A:
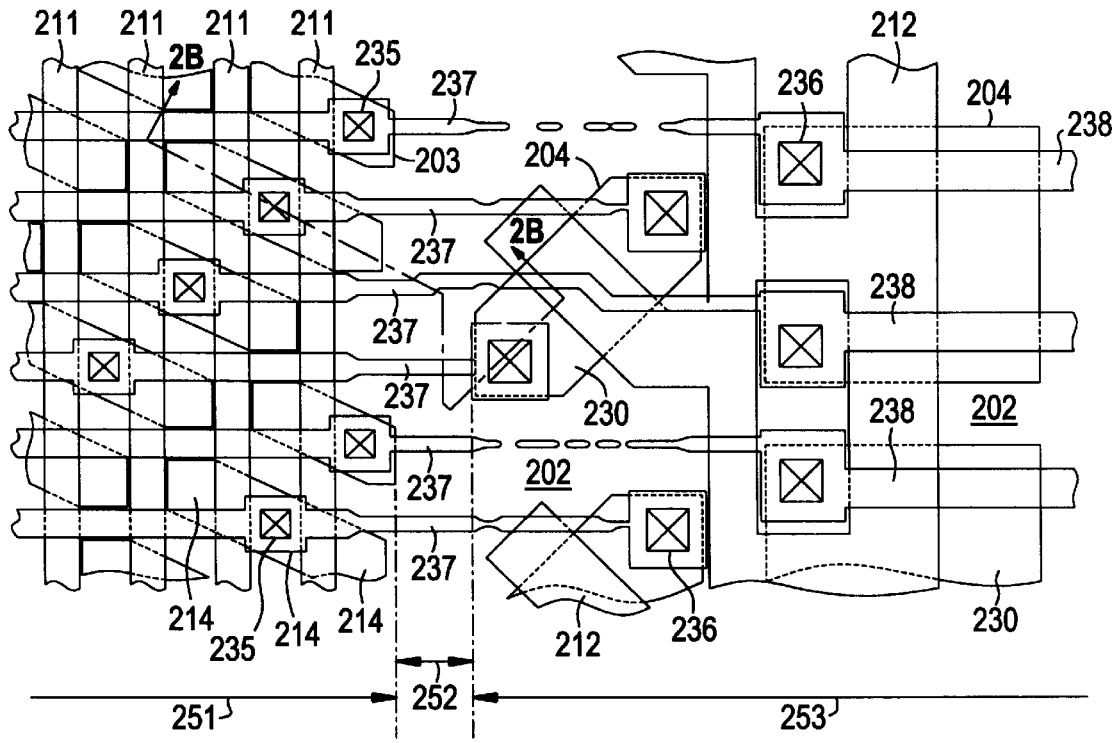
FIGS. 2A and 2B are a plan view and a sectional view showing the conventional DRAM described above respectively, the views explaining the problems of the conventional DRAM.
Figure 2B:
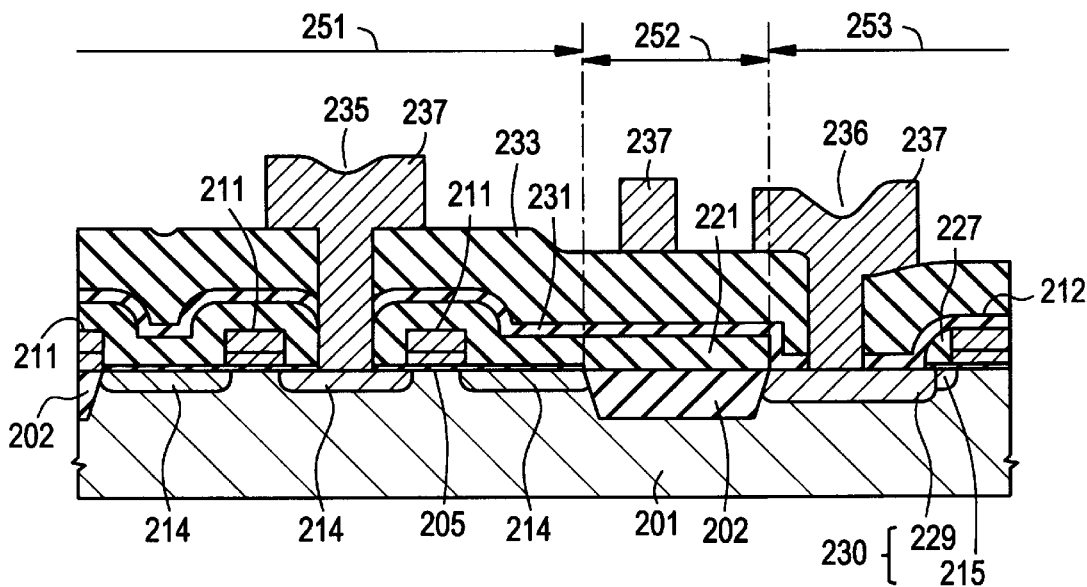
Figure 3A:
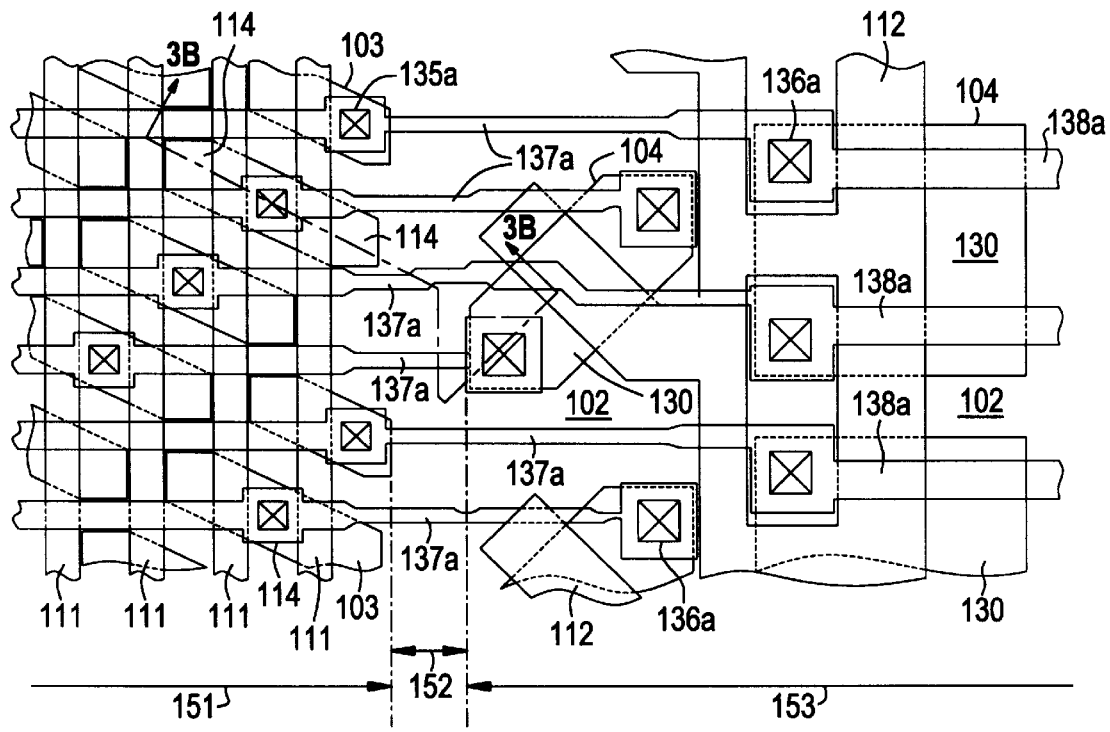
FIGS. 3A and 3B are a plan view and a sectional view showing a first embodiment of the present invention respectively.
Figure 3B:
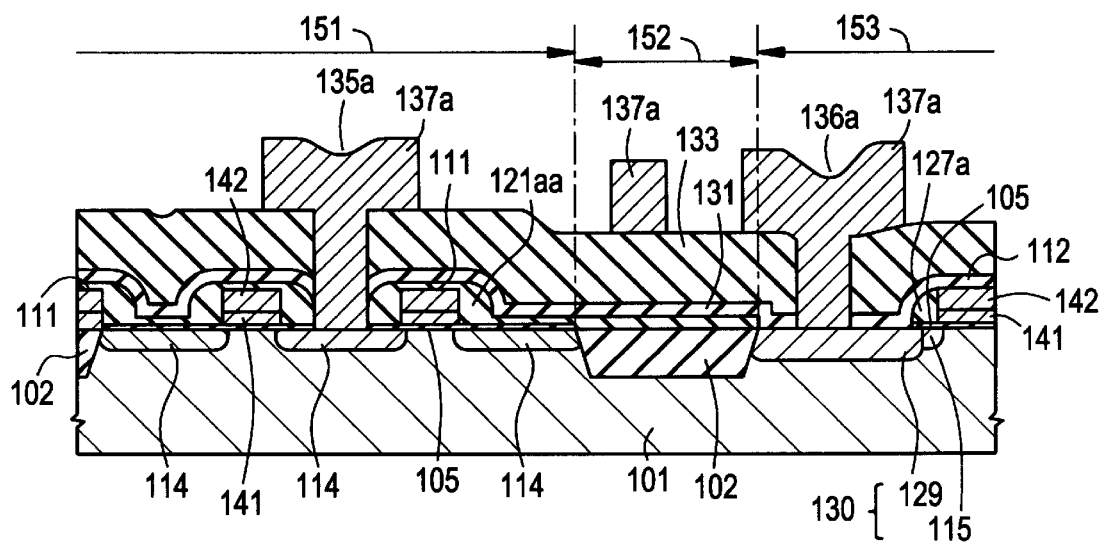

FIG. 3A is a plan model view showing a DRAM, FIG. 3B is a sectional view taken along line A—A of FIG. 3A. The DRAM according to a first embodiment of the present invention is formed on the basis of the 0.25 μm design rule, and is formed in the following manner. Incidentally, in order to avoid the complication of the drawings, views showing the deep N-well, the-N well and the P-well will be omitted.

On the surface of the P-type silicon substrate 101, a deep N-well (not shown) is provided. On the surface of the P-type silicon substrate 101 which is separated from the deep N-well, an N-well (not shown) is provided while on the surface of the deep N-well, a P-well (which is a P-type region)(not shown) is provided. In the P-well, the cell array region 151, the boundary region 152 and (a part of) the peripheral circuit region 153 are provided adjacent to each other. The device separation region of the cell array region 151, and the peripheral circuit 153 including the boundary region 152 comprise grooves provided on the surface of the P-type silicon substrate 101, and a field insulation film 102 (which is formed by the planarization of the silicon oxide film by means of the CVD) the upper surface of which is generally flush with the surface of the P-type silicon substrate 101 the insulation film filling the grooves. The thickness of the field insulation film 102 (the depth of the grooves) is, for example, about 300 nm. The minimum width of (the field insulation film 102 in) the boundary region 152 is, for example, 1.5 μm. In the device formation regions 103 and 104 surrounded by the field insulation film 102, the gate insulation film 105 formed by heat oxidation is provided. The thickness of the gate insulation film 105 is, for example, about 5 nm.

In the cell array region 151 and the peripheral circuit region 153 (in the P-type region), (N-channel) cell transistors constituting a memory cell and N-channel MOS transistors constituting (a part of) the peripheral circuits are provided in plurality respectively. The cell transistors and N-channel MOS transistors comprise respectively a gate insulation film 105, word lines 111 and a gate elecrrode 112 comprising a first conductive film having a (first) thickness (=t1) of, for example, about 200 nm respectively, an $N^-$-type source and drain region 114 (comprising only $N^-$-type diffusion layer) and an LDD-type source and drain region 130 (comprising the $N^-$-type diffusion layer 115 and the $N^+$-type diffusion layer 129).

The depth of the junction of the $N^-$-type source and drain region 114 and the $N^-$-type diffusion layer 115 is, for example, about 70 nm, and the depth of the junction of the $N^+$-type diffusion layer 129 is, for example, about 200 nm. The first conductive film is formed by the lamination of a tungsten silicide film 142 having a thickness of, for example, about 100 nm on the $N^+$-type polycrystal silicon film 141 having a thickness of, for example, about 100 nm. In the place of the tungsten silicide film 142, a titanium silicide film, a cobalt silicide film or a molybdenum silicide film have been used in some cases. The line width (gate length) of the word lines 111 and the gate electrode 112 are, for example, about 0.3 μm and 0.5 μm respectively. The interval between adjacent word lines 111 and the interval between the word lines 111 and the field insulation film 102 are about 0.6 μm respectively. The minimum interval between the gate electrode 112 and the field insulation film 102 via the $N^-$-type diffusion layer 115 is, for example, about 1.0 μm.

The memory cell region 151 and the boundary region 152 including the cell transistors are covered with the silicon oxide film 121aa (comprising the first silicon oxide film). The upper surface and the side of the word lines 111 are directly covered with the silicon oxide film 121aa. The side of the word lines 111 is covered directly with the insulation film spacer 127a formed by the etch-back of the first silicon oxide film (by means of the anisotropic dry etching process). The thickness (=t2) of the insulation film spacer 127a is, for example, about 130 nm, and the thickness (=t3) of the silicon oxide film 121aa at a portion covering an upper surface of the word lines 111 is, for example, about 50 nm. (Details will be described as to the relation of t3<t2), but the first silicon oxide film having a thickness t2 is etched back by 80 nm (by means of the anisotropic dry etching process) at the film formation stage at a portion covering the memory cell region 151 and the boundary cell region 152 so that a silicon oxide film 121aa is provided.

The silicon oxide film 121aa and the peripheral circuit 153 including and the N-channel MOS transistors are covered with the (second) silicon oxide film 131 having a thickness of, for example, about 100 nm. This silicon oxide film 131 is covered with the BPSG film 133 formed by the reflow of the BPSG film formed by means of the APCVD. The interlayer insulation film between the bit lines or the like, cell transistors, N-channel MOS transistors is formed of a lamination layer insulation film, which consists of the silicon oxide film 131 and BPSG film 133. The thickness of the BPSG/film at the film formation stage is, for example, about 200 nm. The highest position of the upper surface of the interlayer insulation film is a portion immediately on the word lines 111 while the lowest position is a portion immediately on the field insulation film 102 (and the $N^+$-type diffusion layer 129) of the peripheral region 153. The maximum step of the upper surface of the interlayer insulation film is, for example, about 190 nm.

On this interlayer insulation film, bit contact holes 135a reaching one of the $N^-$-type source and drain region 114 through the interlayer insulation film and the gate insulation film and contact holes 136a reaching the LDD-type source and drain region 130 through this interlayer insulation film are provided. The contact size of the bit contact holes 136a is wider than the bit contact holes 135a and, for example, one side length thereof is about 0.3 μm. When required, on the surface of the N⁻-type source and drain region 114, and the LDD-type source and drain region 130, there is provided an N⁺-type diffusion layer which is arranged in self-alignment with the bit contact holes 135a, and the contact holes 136a respectively (by means of the ion implantation or the like of a high concentration of phosphorus). Furthermore, an insulation film spacer having a thickness of about 20 nm which covers the side of the bit contact holes 135a and contact holes 136a is provided. Effective contact size of the bit contact holes 135a and the contact holes 136a in this case are set such that one side lengths thereof are about 0.26 μm and about 0.46 μm.

On the surface of this interlayer insulation film, bit lines 137a comprising the second conductive film and a wiring 138a (connecting transistors constituting the peripheral circuit) are provided. The thickness of the second conductive film is, for example, 150 nm, and the second conductive film is constituted of an N⁺-type polycrystal silicon film, a metal film having a high melting point such as a tungsten film or the like, a metal silicide film having a high melting point such as a tungsten silicide film or the like, or a lamination layer film thereof. The bit lines 137a run at right angle with the word lines 111 via a plurality of bit contact holes 135a, the bit lines 137a are connected to the N⁻-type source and drain region 114 of the plurality of the cell transistors via the plurality of bit contact holes 135a, and are connected at least to one LDD-type source and drain region 130 via the contact holes 136a. The minimum interval of the bit lines 137a in the cell array region 151, and the line width (excluding the vicinity of the bit contact holes 135a) is about 0.252 μm and 0.216 μm. Although the detailed reason thereof will be described later, no disconnection of the bit lines 137a is generated at the portion extending to the peripheral circuit region 153 because the maximum step of the upper surface of the BPSG film 133 is about 190 nm.

Although not shown in the drawings, the surface of the interlayer insulation film (formed by the lamination of the BPSG film 133 on the silicon oxide film 131) including the bit lines 137a and the wiring 138a is covered with the second interlayer insulation film. Node contact holes reaching the other of the N⁻-type source and drain region 114 is provided through the second interlayer insulation film, the interlayer insulation film and the gate insulation film. On the surface of the second interlayer insulation film a storage electrode connected to the other of the N⁻-type source and drain region 114 via the node contact holes is provided. At least the upper surface and the side of the storage node electrode are covered with the capacity insulation film. The surface of the capacity insulation film is covered with the cell plate electrode.

Next, a manufacturing method of a DRAM according to a first embodiment of the present invention will be explained. FIGS. 4A through 4G are sectional views of a portion corresponding to line A—A of FIG. 3A, the view showing in an order of steps the manufacturing method of the DRAM. FIGS. 5A and 5B are views showing the characteristic associated with the photoresist film pattern by means of the exposure using the KrF excimer laser. These views are referred to along with FIGS. 3A and 3B.

In the beginning, on the device separation region of the cell array region 151 and the peripheral circuit region 153 including the boundary region 152 on the surface of the P-type silicon substrate 101, grooves are formed which has a depth of, for example, 300 nm. In these grooves, the field insulation film 102 is filled by means of the CVD or the like. Preferably, the upper surface of the field insulation film 102 is generally flush with the surface of the P-type silicon substrate. On the device formation regions 103 and 104 surrounded by the device separation region, a gate insulation film 105 having the thickness of, for example, about 5 nm is formed by heat oxidation. The minimum width of the field insulation film 102 in the boundary region 152 is, for example, about 1.2 μm.

Subsequently, on the overall surface of the substrate, an N⁺-type polycrystal silicon film having, for example, about 100 nm and a tungsten silicide film having a thickness of, for example, about 100 nm are formed. This N⁺-type polycrystal silicon film is formed preferably by using a silane-type gas and phosphane ($PH_3$) and a high concentration of phosphorus is contained at the film formation stage. The tungsten silicide film and the N⁺-type polycrystal silicon film are subsequently patterned by the anisotropic etching process. On the cell array region 151 and the peripheral circuit region 153, the tungsten silicide film pattern 142 is laminated on the N⁺-type polycrystal silicon film pattern 141 respectively with the result that the word lines 111 and the gate electrode 112 having a first thickness (t1) of about 200 nm are formed. The line width (gate length) of the word lines 111 and the gate electrode 112 are, for example, about 0.3 μm and about 0.5 μm respectively. The interval of the adjacent word lines 111 and the interval between the word lines 111 and the field insulation film 102 are, for example, 0.6 μm respectively.

Subsequently, by means of the ion implantation of phosphorus on the order of 30 KeV, and $2 \times 10^{13}$ cm$^{-2}$ using as a mask the word lines 111 and the gate electrode 112, the N⁻-type source and drain region 114 having a junction depth of, for example, about 70 nm and the N⁻-type diffusion layer 115 are formed respectively. In such a process, a memory cell comprising the gate insulation film 105, the word lines 111 and the N⁻-source and drain region 114 is completed. Here, (generally), one of the N⁻-type source and drain region 114 belongs to one of the word lines 111 (one memory cell) respectively while the other of the N⁻-type source and drain region 114 is shared by two of the word lines 111 (two memory cells) located adjacent to each other. The minimum interval between the gate electrode 112 and the field insulation film 102 via the N⁻-type diffusion layer 115 is, for example, about 1.0 μm (see FIGS. 4A, 3A and 3B).

Figure 4A:
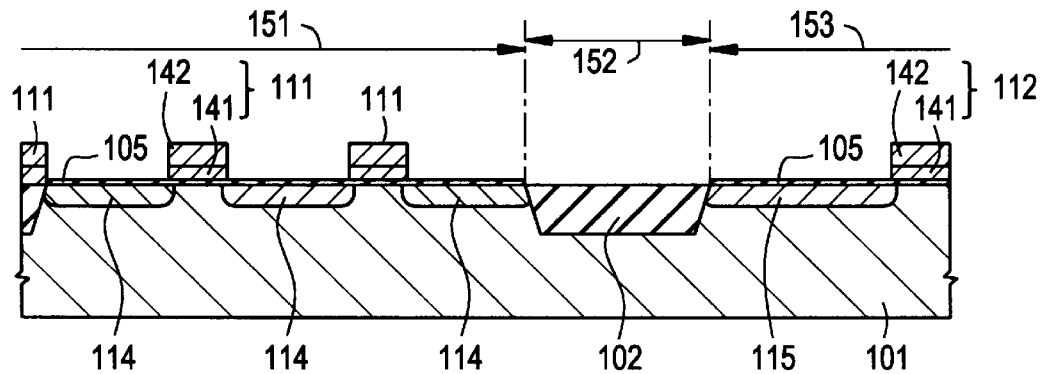
FIGS. 4A through 4G are sectional views showing a manufacturing method of a first embodiment of the present invention in an order of steps, the views showing a portion corresponding to line A—A of FIG. 3A.
Figure 4B:
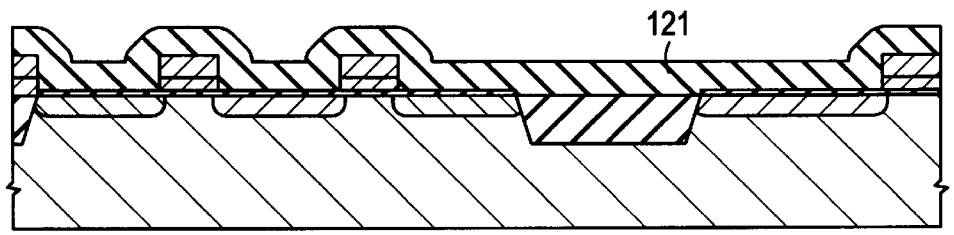
Figure 4C:
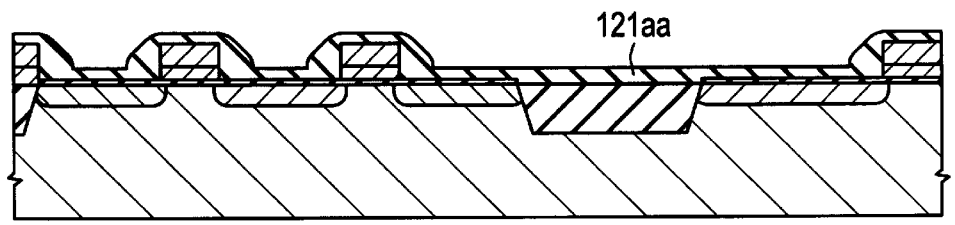
Figure 4D:
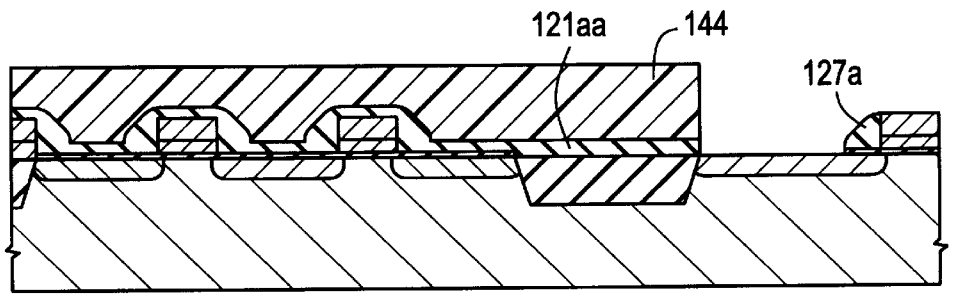
Figure 4E:
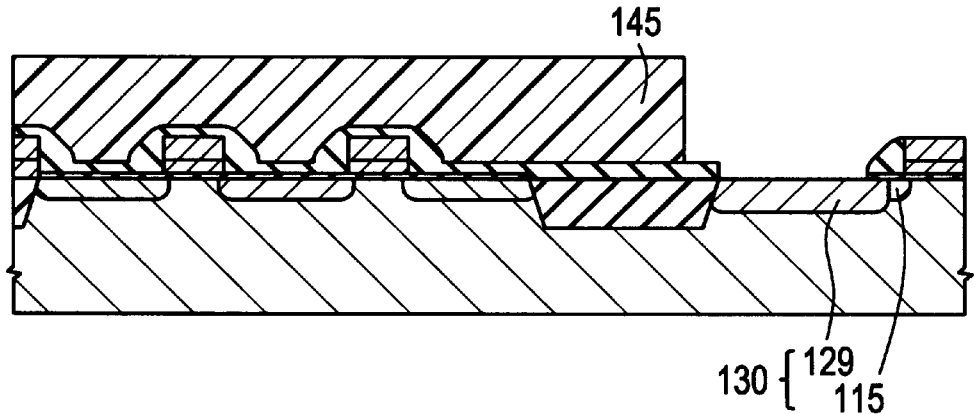
Figure 4F:
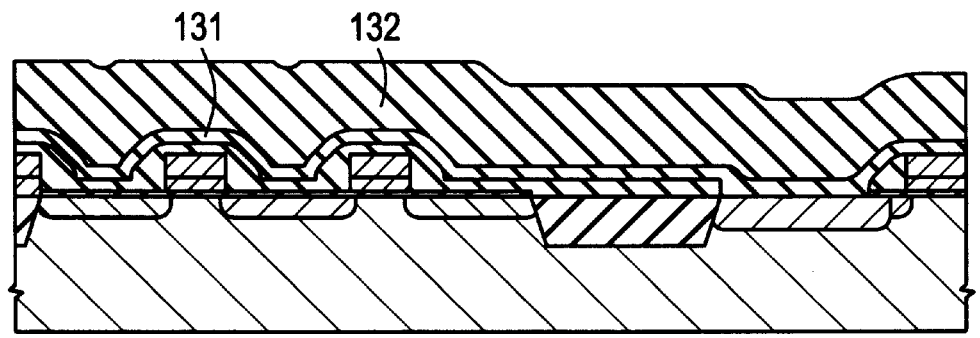
Figure 4G:
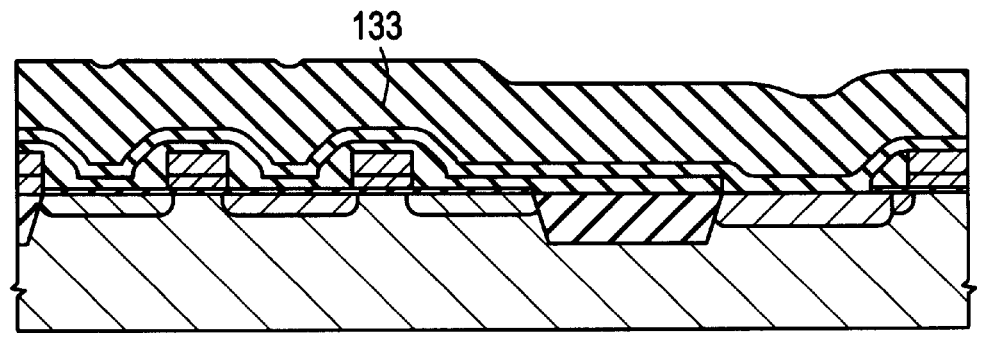
Figure 5A:
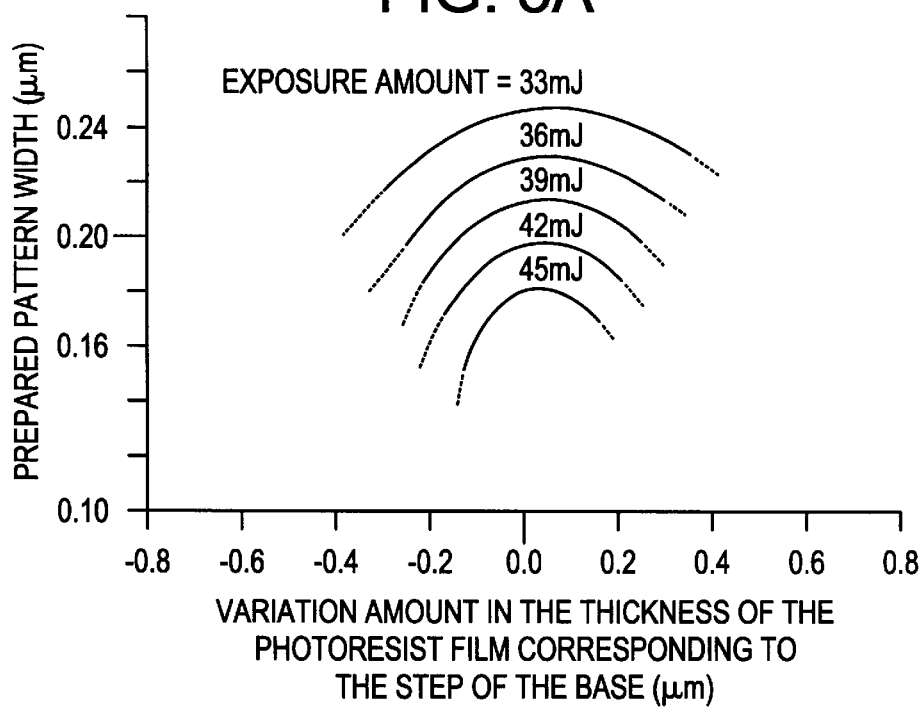
FIGS. 5A and 5B are graphs showing the characteristic of the photoresist film pattern by the exposure using the KrF excimer laser according to the present invention.
Figure 5B:
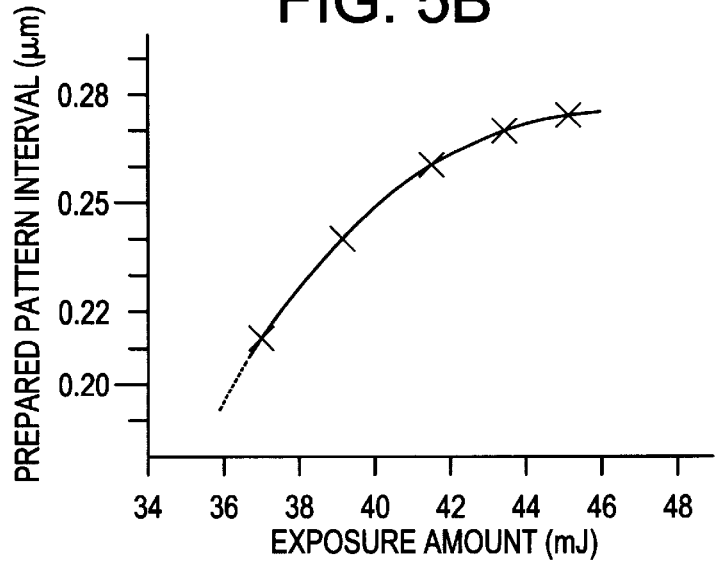

Next, the first silicon oxide film 121 having a second thickness (t2) of, for example, about 130 nm is formed on the overall surface by means of the LPCVD excellent in the coverage of the steps (see FIG. 4B).

Next, the silicon oxide film 121 is etched back to a thickness of, for example, about 80 nm by means of the anisotropic etching process with the result that the silicon oxide film 121aa is retained and formed. The thickness of the silicon oxide film 121aa at the portion of the word lines 111 and the upper surface of the gate electrode 112 is, for example, about 50 nm which is the third thickness (t3), and the thickness of the silicon oxide film 121aa at a portion covering the side of the gate electrode 112 is generally about t2 (see FIG. 4C).

Next, a first photoresist film pattern 144 is formed which has an opening in the peripheral circuit region 153 and which covers the cell array region 151 and the boundary region 152. By means of the anisotropic etching process using as a mask the photoresist film pattern 144, the silicon oxide film 121aa (and the gate insulation film 105) is selectively etched back again with the result that the insulation film spacer 127a (comprising the silicon oxide film 121aa) covering the side of the gate electrode 112 is retained and formed. The thickness of the insulation film spacer 127a is generally about t2 (=130 nm). At the time of the etch-back of the silicon oxide film 121aa, the gate insulation film 105 on the surface of the N⁻-type diffusion layer 115 is also etched and removed (see FIG. 4D).

After the photoresist film 144 described above is removed, at least the cell array region 151 (and the area in which the formation of the P-channel MOS transistor in the peripheral circuit region 153 is predetermined) are covered, and the photoresist film pattern 145 having an opening at the area where the formation of the N-channel MOS transistor (in the peripheral circuit region 153)is predetermined is formed. By means of the ion implantation of arsenic on the order of 60 KeV and $3 \times 10^{15}$ cm$^{-2}$ using as a mask this photoresist film 145 and the heat treatment after the removal of the photoresist film pattern 145, the N⁻-type diffusion layer 129 is formed in self-alignment with the field insulation film 102, (the gate electrode 112 and) the insulation film spacer 127a on the device formation region 104. The depth of the junction of the N⁺-type diffusion layer 129 is, for example, about 200 nm. In such a process, he N-channel MOS transistor constituting the peripheral circuit is completed. The source and drain region of the N-channel MOS transistor comprises a LDD-type source and drain region 130 comprising the N⁺-type diffusion layer 129 and the N⁻-type diffusion layer 115. The thickness of the first oxide silicon film 121 (the insulation film spacer 127a) is regulated with the depth of the junction of the N⁺-type diffusion layer 129 (see FIGS. 4E, 3A and 3B).

Subsequently, by means of the APCVD, the second. silicon oxide film 131 having a thickness of, for example, 100 nm is formed on the overall surface of the substrate. Furthermore, by means of the APCVD using as a material ozone (O₃), TEOS (Si(OC₂H₅)₄), TMOP (PO(OCH₃)₃), and TMB (B(OCH₃)₃), the BPSG film 132 having a thickness of, for example, about 200 nm is formed on the overall surface of the substrate. Here, the reason why the APCVD is adopted for the formation of the silicon oxide film 131 and the BPSG film 132 is that a priority is given to the productivity. The concentration of phosphorus in the BPSG film 132 is, for example, about 4.8 mol %, and the concentration of boron is, for example, 10.3 mol %. At this time, the highest position on the upper surface of the BPSG film 132 is a portion immediately on the word lines 111 while the lowest position on the upper surface thereof is a portion immediately on the field insulation film 102 (in the peripheral circuit region 153) adjacent to the boundary region 152 and the N⁺-type diffusion layer 129. The maximum step on the upper surface of the BPSG film 132 is about 250 nm. This value is equal to the sum of the thickness of the word lines 111 and the thickness of the silicon oxide film 121aa (see FIG. 4F).

Next, heat treatment is carried out in the atmosphere of nitrogen, for example, at 850° C. for about 10 minutes. The BPSG film 132 is reflowed and the BPSG film 133 is provided. By means of this reflow, the maximum step of the upper surface of the BPSG film 133 is decreased to about 190 nm (see FIG. 4G).

Incidentally, even when the reflow condition is changed to, for example, a higher temperature and a longer time with respect to the BPSG film having the thickness and the concentration of phosphorus described above, the decrease in the maximum step of the upper surface described above does not change very much. When the phosphorus concentration of the BPSG film 132 is set to a higher level than the level described above, the deposition of phosphorus is generated and the moisture endurance is decreased. The thickness of the BPSG film 132 is demanded to maintain the productivity, the suppression of the over-hang configuration of the BPSG film obtained by the APCVD and the suppression in the increase in the aspect ratio of the contact holes formed on the interlayer insulation film (which is formed by the lamination of the BPSG film 133 on the silicon oxide film 131). Furthermore, in the case where the BPSG film 132 is thin in this manner, the planarization by means of chemical-mechanical polishing (CMP) is not favorable.

Next, a chemical amplification type and positive type photoresist film (not shown) is formed on the surface of the BPSG film 133. An opening pattern is formed on this photoresist film by the stepper exposure using the KrF excimer laser having an exposure light wavelength (λ) of 248 nm (under the condition that the opening pattern width becomes minimum at this position) while focusing the upper surface of this photoresist film immediately on the word lines 111. The anisotropic etching is carried out with respect to the silicon oxide film by using as a mask this photoresist film with the result that bit contact holes 135a reaching the N⁻-type source and drain region 114 and the contact holes 136a reaching the LDD-type source and drain region 130 or the like are formed. The bit contact holes 135a have one side length of about 0.25 μm and the contact holes 136a have one side length of about 0.3 μm. In the exposure described above, the reason why the opening pattern width at the position described above becomes minimum and is prevented from becoming maximum is that, for example, the contact holes 136a can be formed with certitude.

Incidentally, even with the anisotropic etching process at the time of the formation of the bit contact holes 135a, damage is caused to the surface of the N⁻-type source and drain region 114. However, this damage is caused to a portion in the vicinity of the boundary between the N⁻-type source and drain region and the field insulation film 102 or the word lines 111 with the result that the holding characteristic of the memory cell is hardly deteriorated (see FIGS. 3A and 3B).

When required, by means of the ion implantation of a high concentration of phosphorus, the N⁺-type diffusion layer is formed which is located in self-alignment with the bit contact holes 135a, and contact holes 136a respectively on the surface of the N⁻-type source and drain region 114 and the LDD-type source and drain region 130. Furthermore, when required, an insulation film spacer having a thickness of about 20 nm is formed which covers the side of the bit contact holes 135a and the contact holes 136a. The effective contact size of the bit contact holes 135a and the contact holes 136a have one side length of about 0.26 μm and 0.46 μm respectively.

For example, the second conductive film having a thickness of about 150 nm is formed on the overall surface of the substrate. The method for forming this conductive film is preferably the LPCVD, and this conductive film comprises a high melting point metal film such as N⁺-type polycrystal silicon film, tungsten film or the like, and a high melting point metal film such as tungsten silicide film or the like, or a lamination film of the two kind of films. A chemical amplification and positive type photoresist film (not shown) which covers the surface of this conductive film is formed. A main component of this photoresist film is, for example, BOC-type polyhydroxystyrene (PBOCST) which is obtained by blocking a hydroxyl group of poly-(p-hydroxystyrene) with a butoxycarbonyl group (tBOC).

The line width of the photoresist film pattern which width is thinner than the wavelength λ of the exposure light can be obtained by the increase in the exposure light amount (than the standard exposure light amount). However, along with this, the depth of focus (DOF) becomes shallow. FIG. 4 shows a result which is obtained when the inventors of the present invention measures the characteristic of the KrF excimer laser at the time of using the photoresist film described. The upper surface of the photoresist film becomes generally planar, and the thickness thereof changes with the location corresponding to the step of the base.

FIG. 5A shows a graph showing a relation between the variation amount of the photoresist film and the width of the photoresist film pattern under the condition that the photoresist film pattern width becomes maximum at the focused position. In FIG. 5A, a portion denoted by the solid line is a region where no disconnection of the patterns is generated while a portion denoted by the dot line is a region where the disconnection of the patterns is generated. Here, a difference in the variation amount in the thickness of the photoresist film corresponding to the interval of the portion denoted by the solid line corresponds to the DOF. For reference, 0.216 μm which denotes the pattern width of the design goal is obtained at the exposure light amount of about 40 mJ. At this time, a relation of DOF/2=210 nm is established.

FIG. 5B shows a graph showing a phenomenon in which the pattern width becomes wider and the pattern interval becomes narrower with a decrease in the exposure light amount. The portion denoted by the dot line in FIG. 5B is a region where adjacent patterns are connected at the time of the pattern width of the design goal described above. From this result, it is preferable that the exposure light amount is set to a value larger than 37 mJ.

Subsequently, the photoresist film described above is subjected to stepper exposure at the exposure light amount of, for example, 40 mJ by using the KrF excimer laser by focusing the upper surface of this photoresist film immediately on the word lines 111 (under the condition that the pattern width becomes maximum at this position). By developing this photoresist film, the second photoresist film pattern (not shown) is formed. At this time, the pattern width and the pattern interval of this photoresist film pattern become a value generally approximate to the design goal value.

In the conventional DRAM that has been described by referring to FIGS. 1A through 1D, and FIGS. 2A and 2B, the maximum step of the upper surface of the BPSG film 232 (before the reflow) (which reflects the sum of the thickness (t1) of the word lines 211 and the thickness (t2) of the silicon oxide film 221) is about 330 nm. The maximum step of the BPSG film 233 (after the reflow) is about 270 nm. As apparent from FIG. 4, when priority is given to the interval of the photoresist film pattern, it is preferable that the exposure amount is 38 mJ or more, but the DOF/2 at this time is about 260 nm with the result that it means that no favorable exposure condition exist in the conventional DRAM.

On the other hand, according to a first embodiment of the present invention, (when the exposure light amount is set to 40 mJ, a relation of DOF/2=210 nm is established) so that even when the maximum step of the upper surface of the BPSG film 132 is about 250 nm (which is larger than DOF/2), the maximum step (=about 190 nm) of the reflowed BPSG film 133 becomes smaller than DOF/2 with the result that the object photoresist pattern is obtained. What is important here is that the silicon oxide film 121 having a thickness of t2 is etched back thereby obtaining a silicon oxide film 121aa having a thickness of t3. When such process is not carried out, the result of the maximum step of the upper surface of the BPSG film 133+(t2−t3)=270 nm>DOF/2 (however, the value is obtained at 40 mJ) is established, and the result is the same as the conventional one.

By means of the anisotropic etching of the second conductive film described above using as a mask the second photoresist film pattern, the bit lines 137a and the wiring 138a or the like are formed. The bit lines 137a are connected to the plurality of cell transistors via the bit contact holes 135a and are connected to at least one of the N-channel MOS transistors constituting the peripheral circuit via the contact holes 136a. The wiring 137a is used for the connection between the N-channel MOS transistors constituting the peripheral circuit via the contact holes 137a. The bit lines 136a run at right angle with the word lines 111 via the interlayer insulation film comprising the BPSG film 133 and the silicon oxide film 131 and the silicon oxide film 121 (see FIGS. 3A and 3B).

Incidentally, in the exposure described above for the formation of the photoresist film patterning for the patterning of the bit lines 137a and the wiring 138a, the reason why the photoresist film pattern width at the position described above is set to maximum is to avoid the short circuit of the adjacent bit lines. The line width of the bit lines 137a at the portion of the bit contact holes 135a is set to about 0.5 μm and the interval of the bit lines 137a at the portion where bit contact holes are located adjacent to each other becomes minimum. Consequently, it is essential to completely avoid the short circuit between the bit lines 137a at the portion where the bit contact holes 135a are located adjacent to each other.

After that (not shown), the second interlayer insulation film is formed on the overall surface of the substrate. After the node contact holes reaching the other of the N⁻-type source and drain region through the second interlayer insulation film, the BPSG film 133 and the silicon oxide film 131 (and the gate insulation film 105) are formed, a storage node electrode connected to the cell transistors via the node contact holes is formed. Furthermore, the capacity insulation film, the cell plate electrode or the like are formed with the result that a DRAM according to a first embodiment of the present invention is completed.

As has been described, according to a first embodiment of the present invention, the insulation film spacer having a thickness of t2 covering directly the side of the gate electrode of the MOS transistor constituting the peripheral circuit and the insulation film having a thickness of t3 covering directly the side and the upper surface of the word lines are formed of the first silicon oxide film, the thickness of the word lines becomes t1. When the maximum step of the upper surface of the interlayer insulation film between the bit lines and the word lines is set to H, it is easy to form a state represented by a relation of t1+t3>DOF/2, DOF/2>H>DOF/2−(t2−t3) with the result that it becomes easy to avoid the short circuit and the disconnection of the bit lines without the sacrifice of the productivity.

Incidentally, in a first embodiment of the present invention, the numeric values including t1, t2, t3 and the like and each kind of constituent material or the like are not limited to the values and materials described above. Furthermore, the technical idea of a first embodiment (which has been described by giving an example of the exposure using the KrF excimer laser which has a wavelength λ=248 nm) can be applied to the DRAM formed on the basis of the 0.18 μm design rule in which the ArF excimer laser having a wavelength of λ=193 nm is adopted by appropriately selecting each kind of values.

Incidentally, it goes without saying that the present invention is not limited to a first embodiment described above.

Figure 6A:
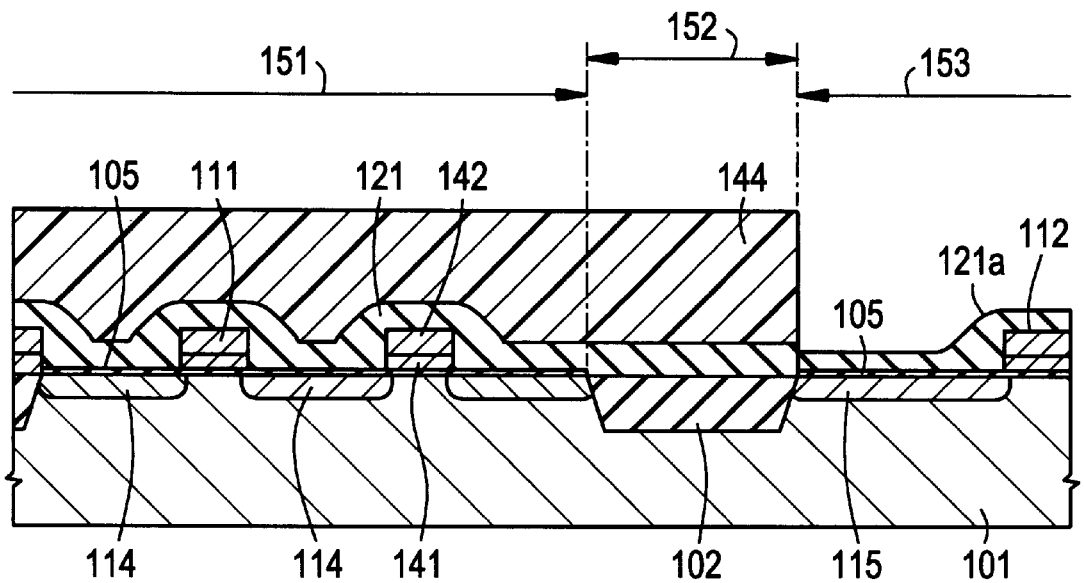
FIGS. 6A and 6B are sectional views showing a main steps in the manufacture of a second embodiment according to the present invention.
Figure 6B:
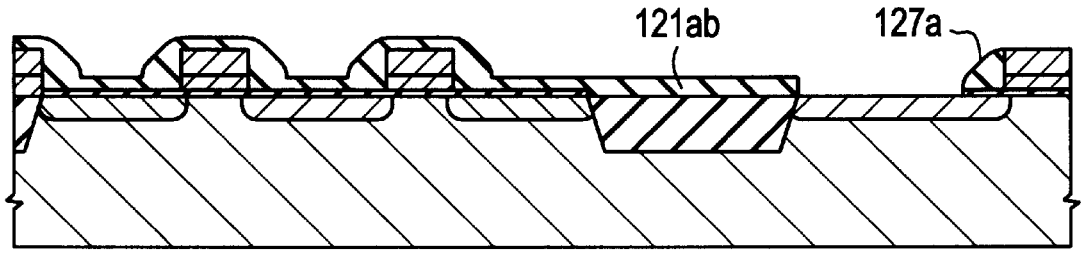

Next, a second embodiment of the present invention will be explained by referring to FIGS. 6A and 6B. FIGS. 6A and 6B are sectional views showing main steps in the manufacture of the DRAM at a portion corresponding to line A—A of FIG. 3A. A second embodiment is different from a first embodiment in the formation method of the first silicon oxide film that is retained between the insulation film spacer comprising the first silicon oxide film directly covering the side of the gate electrode and the interlayer insulation film, and the word lines.

In the beginning, in the same manner as Embodiment describe above, grooves having a depth of about 300 nm are formed on the device separation region of the cell array region 151 and the peripheral circuit region 153 including the boundary region 152 on the surface of the P-type silicon substrate 101, and a field insulation film 102 is filled in grooves by means of the CVD. Preferably, the upper surface of the field insulation film 102 is generally flush with the surface of the P-type silicon substrate. On the surface of the P-type silicon substrate surrounded by the device separation region, the gate insulation film 105 having a thickness of, for example, about 5 nm is formed. The minimum width of (the field insulation film 102 in) the boundary region 152 is, for example, about 1.2 μm.

Subsequently, an N$^+$-type polycrystal silicon film having a thickness of, for example, about 100 nm and a tungsten silicide film having a thickness, for example, about 100 nm are formed on the overall surface of the substrate. This tungsten silicide film and the N$^+$-type polycrystal silicon film are patterned one after another by means of the anisotropic etching process with the result that a tungsten silicide film pattern 142 is laminated on the N$^+$-type polycrystal silicon film pattern 141 on the cell array region 151 and the peripheral circuit region 153 and the word lines 111 and the gate electrode 112 having a first thickness (t1) are formed. The line width (gate length) of the word lines 111 and the gate electrode 112 are, for example, about 0.3 μm and about 0.5 μm respectively. The interval between adjacent word lines 111 and the interval between the word lines 111 and the field insulation film 102 are, for example, 0.6 μm respectively.

Subsequently, by means of the ion implantation of phosphorus using as a mask the field insulation film 102, the word lines 111 and the gate electrode 112, the N$^-$-type source and drain region 114 having a junction depth of, for example, about 70 nm and the N$^-$-type diffusion layer 115 are formed respectively. As a consequence, a memory cell is completed which comprises the gate insulation film 105, the word lines 111 and the N$^-$-type source and drain region 114 are completed. The minimum interval between the gate electrode 112 and the field insulation film 102 via the N$^-$-type diffusion layer 115 is, for example, about 1.0 μm.

Next, in the same manner as a first embodiment described above, the first silicon oxide film having the second thickness (t2) of, for example, about 130 nm is formed on the overall surface of the substrate by means of the LPCVD.

Next, unlike a first embodiment described above, a first photoresist film pattern 144 is formed which has an opening on the peripheral circuit region 153 and which covers the cell array region 151 and the boundary region 152 on the surface of the silicon oxide film 121. By means of the anisotropic etching process using as a mask this photoresist film pattern 144, the silicon oxide film 121 is selectively etched back by about 80 nm with the result that the silicon oxide film 121$a$ is retained and formed (see FIG. 6A).

After the photoresist film pattern 144 is removed, the silicon oxide film 121$a$ and the silicon oxide film 121 are etched back until the surface of the N$^-$-type diffusion layer 115 and the upper surface of the gate electrode 112 are exposed with the result that the silicon oxide film 121 is formed into the silicon oxide film 121$ab$ having the third thickness (=about 50 nm) and the insulation film spacer 127$a$ covering the side of the gate electrode 112 is retained and formed. The thickness of the insulation film spacer 127$a$ is generally about t2 (=130 nm). At the time of this etchback, the gate insulation film 105 on the surface of the N$^-$-type diffusion layer 115 is also etched and removed (see FIG. 6B).

The manufacturing steps after that is the same as a first embodiment described above. A second embodiment has an advantage that is possessed by a first embodiment described above. Furthermore, a second embodiment can be applied to the exposure using the ArF excimer laser.

The present invention is not limited to a first embodiment and a second embodiment. In a first embodiment and a second embodiment, the insulation film spacer directly covering the side of the gate electrode of the MOS transistor constituting the peripheral circuit and the insulation film directly covering the upper surface and the side of the word lines of cell transistors are both the first silicon oxide film.

In a third embodiment of the present invention, the insulation film spacer directly covering the side of the gate electrode of the MOS transistor constituting the peripheral circuit comprises an insulation film in which a silicon nitride film is laminated on the first silicon oxide film. Furthermore, the insulation film directly covering the upper surface and the side of the word lines of the cell transistors comprises the first silicon oxide film. Furthermore, the side of the word lines is covered by the silicon nitride film spacer (comprising the silicon nitride film) via this first silicon oxide film.

Figure 7A:
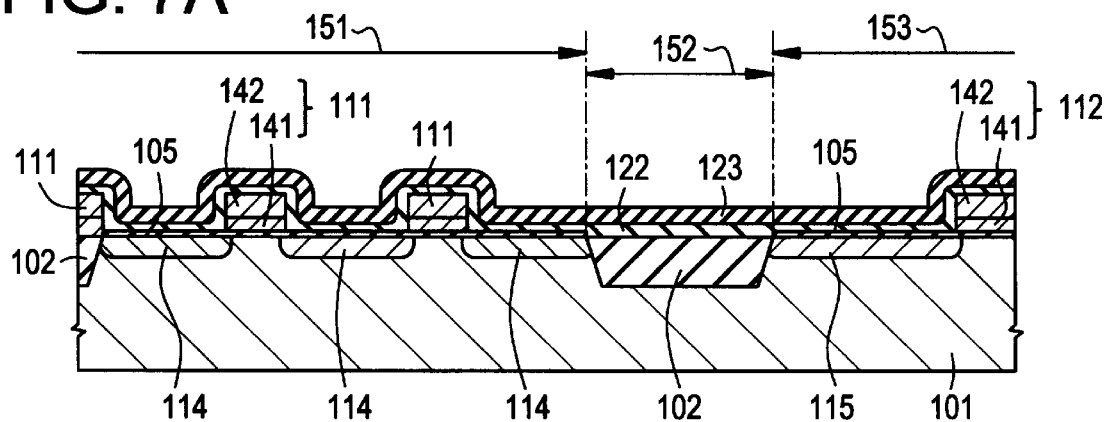
FIGS. 7A through 7F are sectional views showing in an order of steps a manufacturing method of a third embodiment according to the present invention.
Figure 7B:
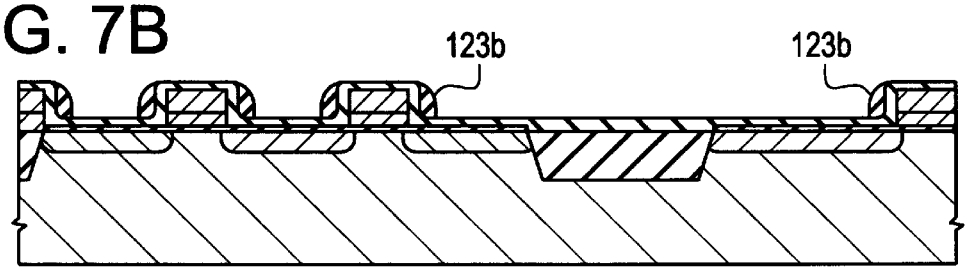
Figure 7C:
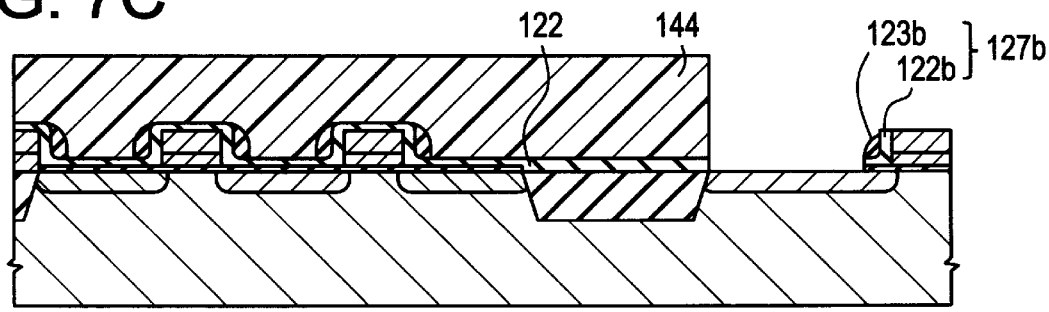
Figure 7D:
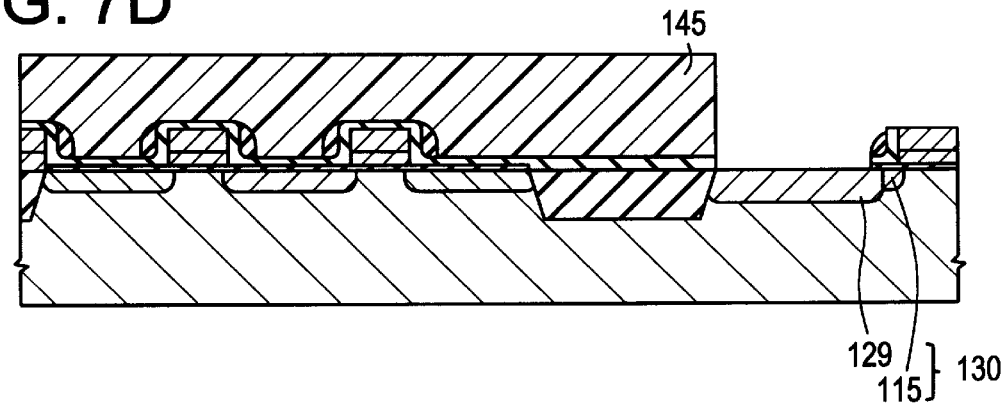
Figure 7E:
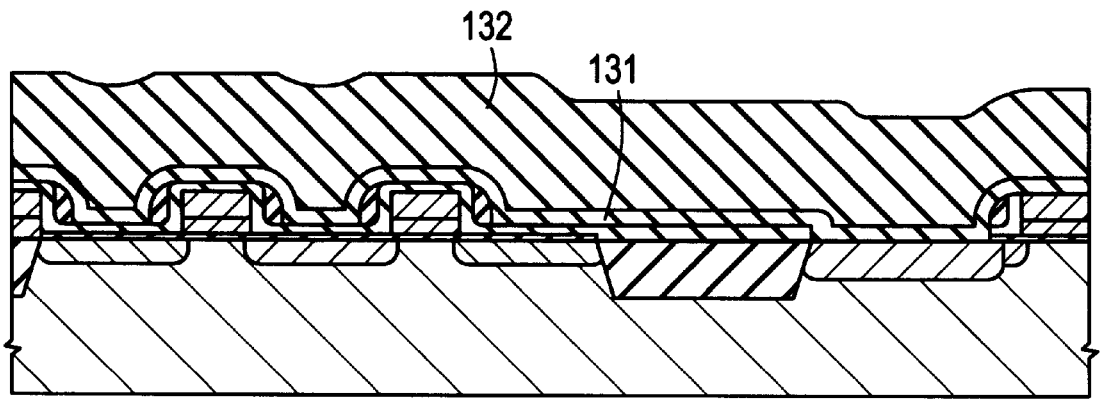
Figure 7F:
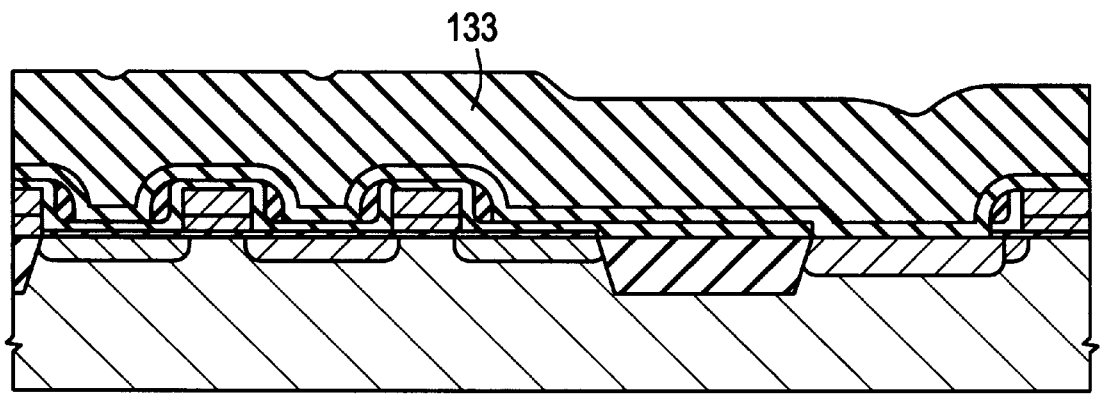
Figure 8A:
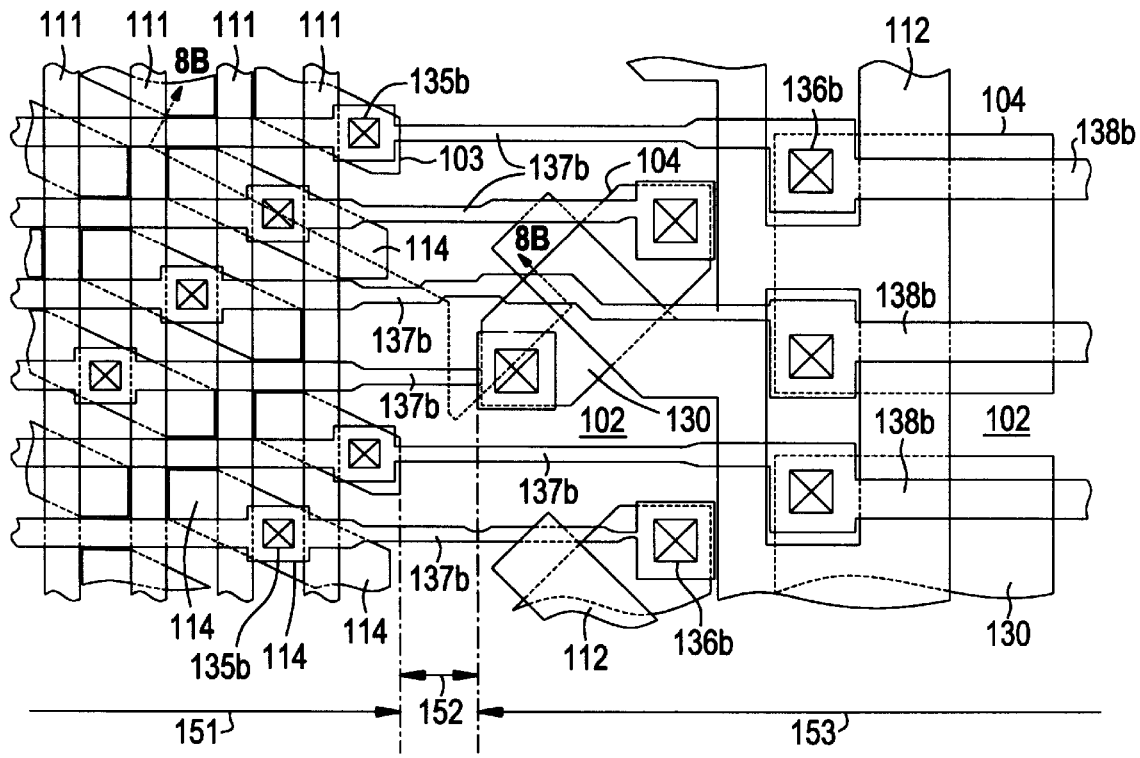
FIGS. 8A and 8B are a plan view and a sectional view showing the third embodiment described above.
Figure 8B:
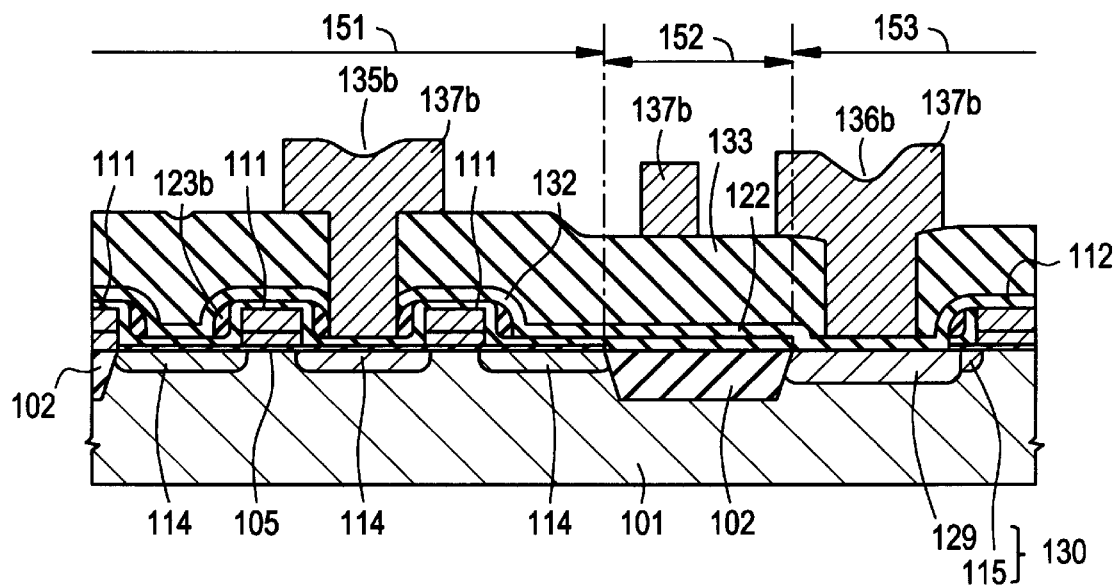

By referring to FIGS. 7A through 7F showing sectional model views of the steps in the manufacture of the DRAM and FIGS. 8A and 8B showing a plan model view and a section model view of the DRAM, a manufacturing method of the DRAM according to a third embodiment will be explained. Incidentally, FIGS. 7A through 7F are sectional views showing the manufacturing steps at a position corresponding to line A—A of FIG. 8A.

In the beginning, the DRAM is formed in the same method as a first embodiment described above until the formation of the N$^-$-type source and drain region 114, and the N$^-$-type diffusion layer 115. up to this stage, the values and the constituent materials of each kind of device parameters, process parameters or the like may be the same as a first embodiment described above. Subsequently, the first silicon oxide film 122 having a thickness (=t2) of, for example, about 50 nm is formed on the overall surface by means of the LPCVD. Furthermore, the silicon nitride film 123 having a thickness of, for example, about 80 nm is formed on the overall surface of the substrate by means of the LPCVD (see FIG. 7A).

Next, by means of the anisotropic dry etching using chlorine (Cl$_2$) as an etching gas, the silicon nitride film 123 is selectively etched back with the result that the silicon nitride film spacer 123$b$ is retained and formed on the word lines 111 and the side of the gate electrode 112 via the silicon oxide film 122 (see FIG. 7B).

Next, the first photoresist film pattern 144 having an opening on the peripheral circuit region 153 and covering the cell array region 151 and the boundary region 152 is formed. By means of the anisotropic etching using as a mask this photoresist film pattern 144 and using tetrafluoromethane ($CF_4$) as an etching gas, the silicon nitride film spacer 123b and the silicon oxide film 122 (and the gate insulation film 105) are etched back with the result that the insulation film spacer 127b (formed by a lamination of the silicon nitride film spacer 123ba on the silicon oxide film 122b) covering the side of the gate electrode 112 is retained and formed. In this etching process, it is easy to generally equalize the etching rate with respect to the silicon nitride film and the silicon oxide film. The thickness of the insulation film spacer 127b is generally t2+t3 (see FIG. 7C).

After the photoresist film 144 described above is removed, the photoresist film pattern 145 is formed which covers at least the cell array region 151 (and the region in the peripheral circuit region 153 where the formation of the P-channel MOS transistor is predetermined) and which has an opening in the region (in the peripheral circuit region 153) where the formation of the N-channel MOS transistor is predetermined.

By means of the ion implantation or the like of a high concentration of arsenic using this photoresist film 145 as a mask, the $N^+$-type diffusion layer 129 is formed in self-alignment with the field insulation film 102, the gate electrode 112 and the insulation film spacer 127b on the peripheral circuit region 153 (on the surface of the P-type silicon substrate 101). The junction depth of the $N^+$-type diffusion layer 129 is, for example, about 200 nm. In such a process, the N-channel MOS transistor constituting the peripheral circuit is completed (see FIG. 7D).

Subsequently, in the same manner as a first embodiment described above, the second silicon oxide film 131 having a thickness of, for example, about 100 nm is formed on the overall surface of the substrate by means of the APCVD. Furthermore, the BPSG film 132 having a thickness of, for example, about 200 nm is formed on the overall surface of the substrate by means of the APCVD. At this time, the highest position on the upper surface of the BPSG film 132 is a portion immediately on the word lines 111 while the lowest position of the upper surface thereof is a portion immediately on the field insulation film 102 and the $N^+$-type diffusion layer 129 (in the peripheral circuit region 153) located adjacent to the boundary region 152. The maximum step of the upper surface of the BPSG film 132 is about 250 nm. This value is equal to the sum of the thickness of the word lines 111 and the thickness of the silicon oxide film 122 (see FIG. 7E).

Next, heat treatment is carried out in the atmosphere of nitrogen, for example, at 850° C. for about 10 minutes, and the BPSG film 132 is reflowed so that the BPSG film 133 is provided. By this reflow, the maximum step of the upper surface of the BPSG film 133 is decreased to about 190 nm (see FIG. 7F).

Next, the chemical amplification type and positive type photoresist film is formed on the surface of the BPSG film 133. By focusing the upper surface of the photoresist film immediately on the word lines 111, (under the condition that the opening pattern width becomes minimum at this position), the opening pattern is formed on this photoresist film by means of stepper exposure using the KrF excimer laser. The anisotropic etching process is carried out with respect to the silicon oxide film using as a mask this photoresist film with the result that bit contact holes 135b reaching the $N^-$-type source and drain region 114 and contact holes 136b reaching the LDD-type source and drain region 130 or the like are formed. The bit contact holes 135b have one side length of about 0.25 µm while the contact holes have one side length of about 0.3 µm.

When required, by means of the ion implantation of a high concentration of phosphorus, the $N^+$-type diffusion layer is formed in self-alignment with the bit contact holes 135b and the contact holes 136b respectively on the surface of the $N^-$-type source and drains region 114 and the LDD-type source and drain region 130. Furthermore, when required, an insulation film spacer covering the side of the bit contact holes 135b and contact holes 136b is formed, the spacer having a thickness of about 20 nm. The effective contact size of the bit contact holes 135b and the contact holes 136b in this case has one side length of about 0.26 µm and 0.46 µm respectively.

For example, the second conductive film having a thickness of about 150 nm is formed on the overall surface of the substrate. Preferably, the manufacturing method of this conductive film is the LPCVD. This conductive film comprises a high melting point metal film such as the $N^+$-type polycrystal silicon film, a tungsten film or the like, a high melting point metal silicide film such as the tungsten silicide film or the like, or a lamination layer of the metal film and the metal silicide film. The chemical amplification type and positive type photoresist film (not shown) covering the surface of the conductive film is formed. The main component of this photoresist film is, for example, tBOC-type polyhydroxystyrene (PBOCST). This main component is subjected to stepper exposure using the KrF excimer laser with the result that the second photoresist film pattern is formed.

By means of the anisotropic etching of the second conductive film using as a mask the second photoresist film pattern described above, the bit lines 137b, the wiring 138b or the like are formed. The bit lines 137b are connected to a plurality of cell transistors via the bit contact holes 135b, and are connected to at least one of the N-channel MOS transistors constituting the peripheral circuit via the contact holes 136b. The wiring 138b is used for the connection between N-channel MOS transistors or the like constituting the peripheral circuit via the contact holes 136b. The bit lines 137b run at right angle with the word lines 111 via the BPSG film 133, the interlayer insulation film comprising the silicon oxide film 131 and the silicon oxide film 122 (see FIGS. 8A and 8B).

According to a third embodiment, since the thickness of the insulation film spacer 127b directly covering the side of the gate electrode 112 of the MOS transistor constituting the peripheral circuit is t2+t3, the thickness of the first silicon oxide film 122 directly covering the side and the upper surface of the word lines 111 is t2, and the thickness of the word lines 111 is t1, it is easy to establish a relation of t1+t2>DOF/2, and DOF/2>H>DOF/2−t3 wherein symbol H denotes the maximum step of the upper surface of the interlayer insulation film between the bit lines 137b and the word lines 111.

Consequently, it becomes easy to avoid the short circuit and the disconnection of the bit lines 137b without sacrificing the productivity.

After that (not shown in the drawings), the second interlayer insulation film is formed on the overall surface of the substrate. After the node contact holes reaching the other of the N⁻-type source and drain region 114 through the second interlayer insulation film, the BPSG film 133, and the silicon oxide film 131 (and the gate insulation film 105) is formed, a storage electrode connected to the cell transistors via the node contact holes is formed. Furthermore, the capacity insulation film, the cell plate electrode or the like are formed with the result that the DRAM according to a third embodiment is completed.

A fourth embodiment has the same effect as a first embodiment and a second embodiment described above. In addition, according to a third embodiment, since the insulation film spacer or the like is formed of the first silicon oxide film and the silicon nitride film, the control of the thickness such as t2, t3 or the like is more favorable than a first embodiment. As a consequence, a third embodiment is more suitable to the DRAM that is made fine by the adoption of the ArF excimer laser than Embodiments 1 and 2 described above.

Incidentally, also in a third embodiment, the values including t1, t2, t3 or the like and constituent materials or the like of each kind of film are not limited to the values and the materials described above.

Next, a forth embodiment of the present invention will be explained. A fourth embodiment is also different from Embodiments 1 and 2 described above. In a forth embodiment, the insulation film spacer directly covering the side of the gate electrode of the MOS transistor constituting the peripheral circuit comprises an insulation film in which the second silicon oxide film is laminated on the first silicon oxide film. Furthermore, the insulation film directly covering the upper surface and the side of the word lines of the cell transistors comprises a lamination layer insulation film of the first silicon oxide film and an extremely thin silicon nitride film. Furthermore, the side of the word lines is covered with the silicon oxide film spacer (comprising the second silicon oxide film described above) via this lamination layer insulation film.

Figure 9A:
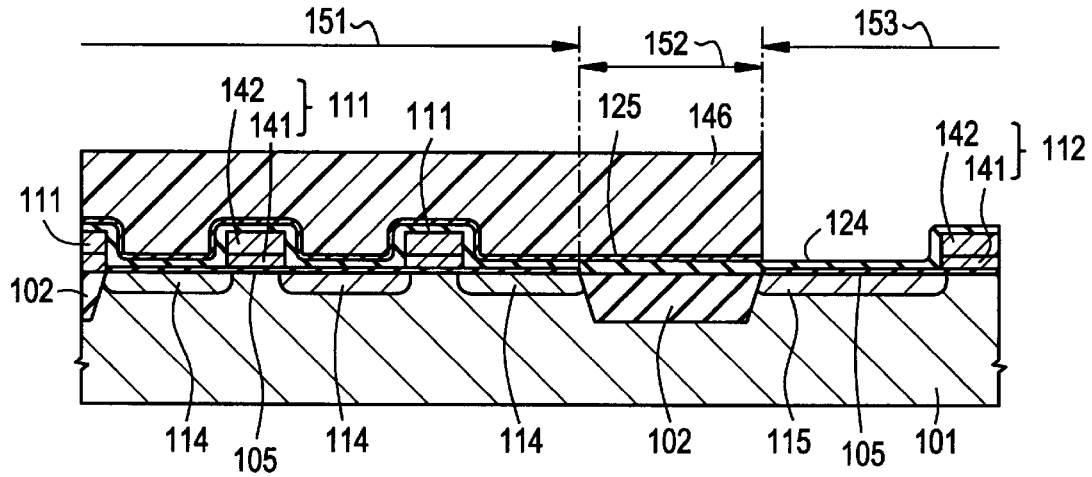
FIGS. 9A through 9F are sectional views showing in an order of steps a manufacturing method of a fourth embodiment according to the present invention.
Figure 9B:
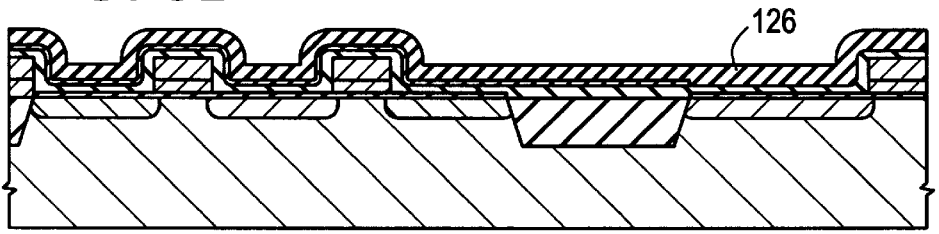
Figure 9C:
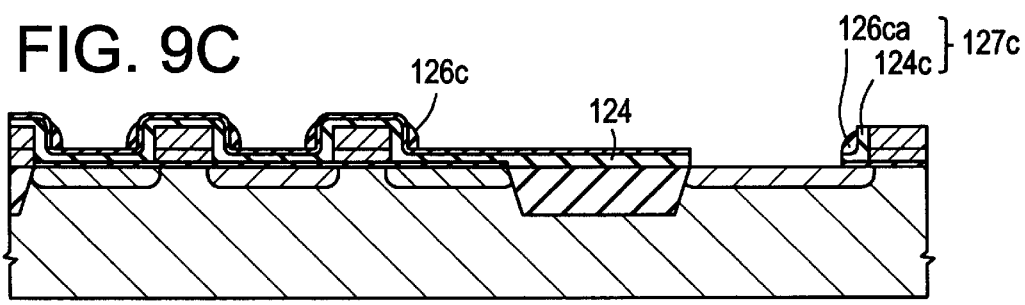
Figure 9D:
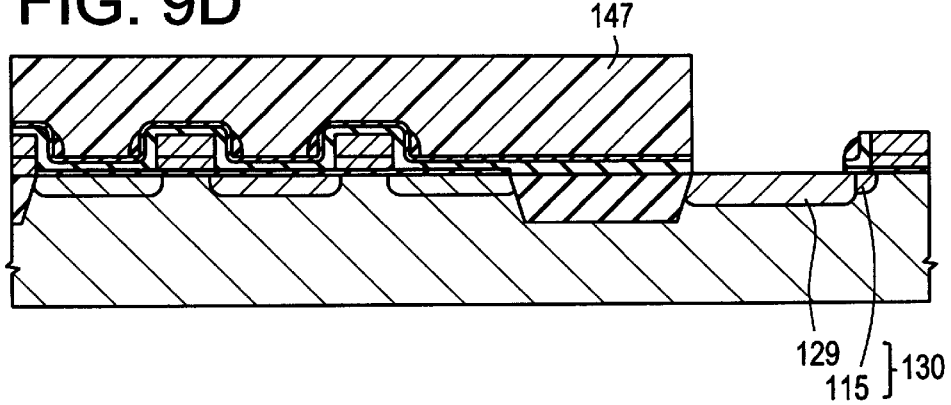
Figure 9E:
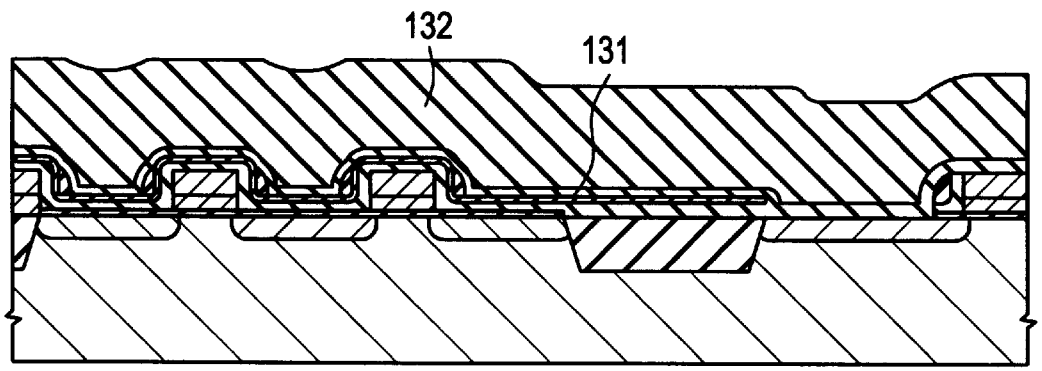
Figure 9F:
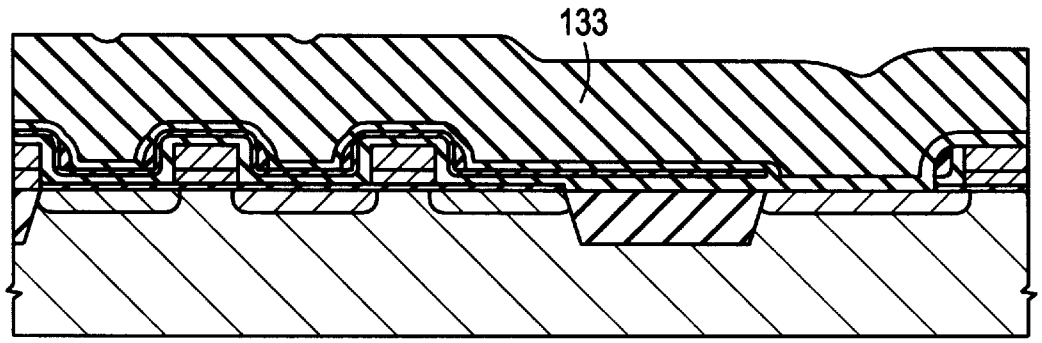
Figure 10A:
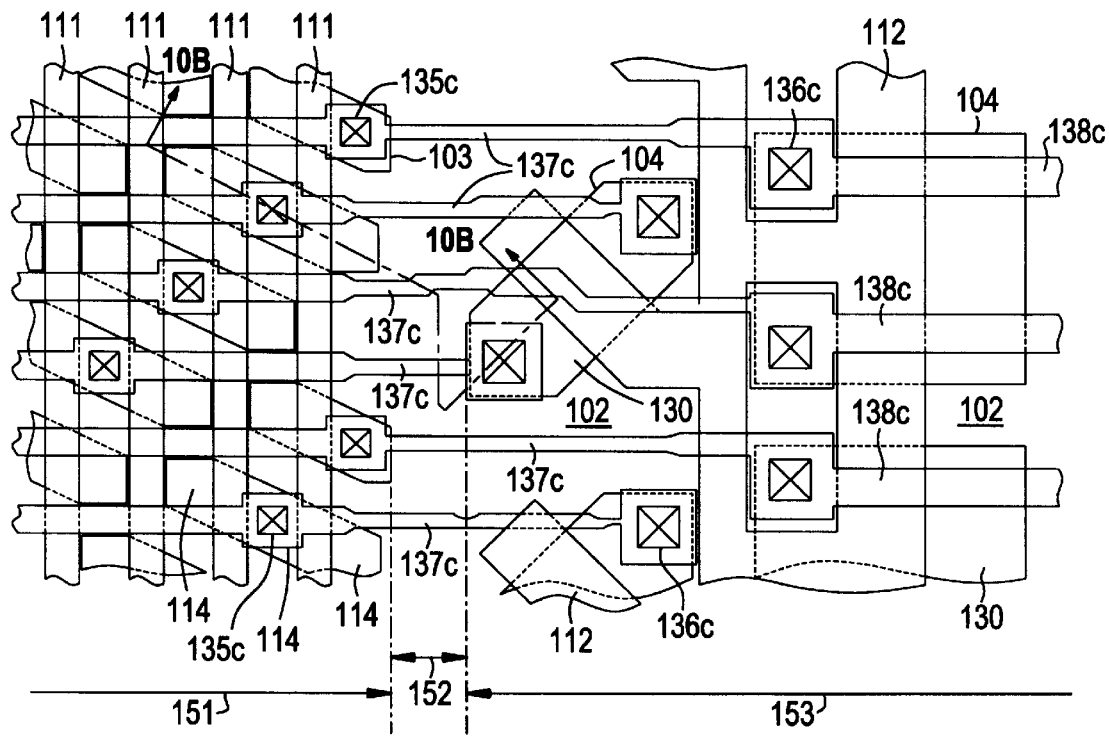
FIGS. 10A and 10B are a plan view and a sectional view showing the fourth embodiment described above.
Figure 10B:
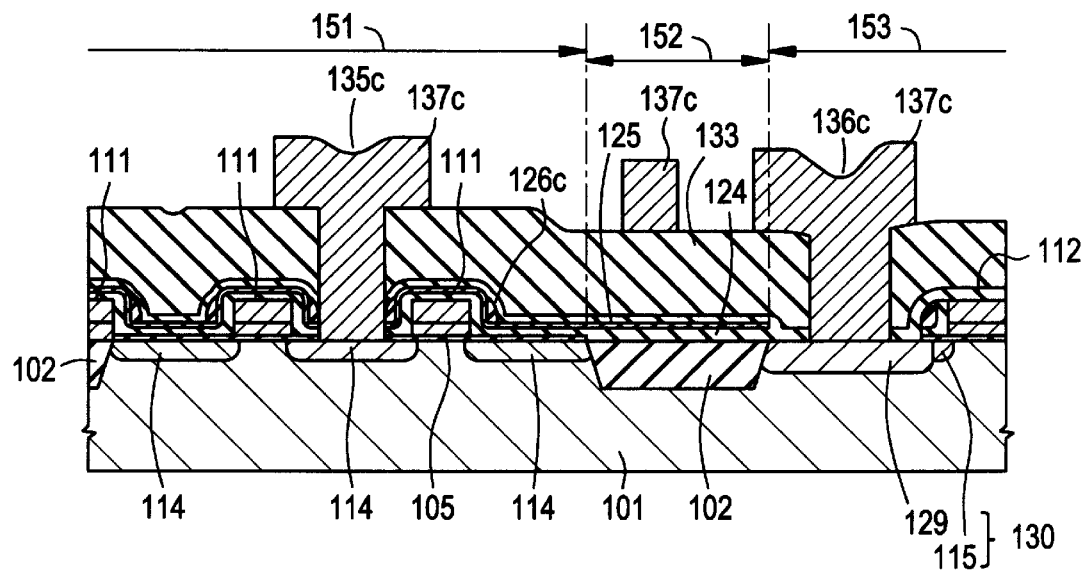

FIGS. 9A through 9F are sectional views showing in an order of steps a manufacturing method of the DRAM according to a fourth embodiment. FIGS. 10A and 10B are a plan view and a sectional view showing the DRAM respectively. FIGS. 9A through 9F are sectional model views showing the steps in the manufacture of the DRAM at a position corresponding to line A—A of FIG. 10A.

In the beginning, until the formation of the N⁻-type source and drain region 114 and N⁻-type diffusion layer 115, a fourth embodiment is formed in the same manner as a first embodiment described above. The values and the constituent materials or the like such as each kind of device parameters, process parameters or the like up to this stage may be the same as a first embodiment described above.

Next, the first silicon oxide film 124 having a thickness of, for example, about 45 nm is formed on the overall surface of the substrate by means of the LPCVD. The thickness (=t2) of the lamination layer insulation film formed by a lamination of the silicon nitride film 125 on the silicon oxide film 124 is about 50 nm. Subsequently, the first photoresist film pattern 146 is formed which has an opening in the peripheral circuit region 153 and which covers the cell array region 151 and the boundary region 152. By means of the isotropic dry etching process using as a mask this photoresist film 145 and using the sulfur hexafluoride as an etching gas, the silicon nitride film 125 is selectively etched back with the result that the silicon nitride film 125 covering the peripheral circuit region 153 is removed. The reason why the appropriate isotropic etching is carried out with respect to the silicon nitride film 125 is to not to retain the silicon nitride film 125 on the side of the gate electrode (see FIG. 9A).

Next, the photoresist film pattern 146 is removed. subsequently, the second silicon oxide film 126 having a thickness of, for example, 80 nm is formed on the overall surface of the substrate by means of the LPCVD (see FIG. 9B).

Next, the silicon oxide films 126 and 124 are selectively subjected to the anisotropic etching process by using, for example, octafluoro-cyclobutane ($C_4F_8$) as an etching gas. As a consequence, on the side of the word lines 111, the silicon oxide film spacer 126c is retained and formed via the lamination layer insulation film formed by a lamination of the silicon nitride film 125 on the silicon oxide film 124. On the side of the gate electrode 112, the insulation film spacer 127c is retained and formed wherein the silicon oxide film spacer 126ca is laminated on the silicon oxide film spacer 124c. In the etch-back of this anisotropic etching process, the silicon nitride film 125 functions as a stopper of the etching process. The thickness of the insulation film spacer 127c is generally t2+t3 (see FIG. 9C).

The photoresist film pattern 147 is formed which covers at least the cell array region 151 (and the region where the formation of the P-channel MOS transistor is predetermined in the peripheral circuit region 153) and which has an opening in the region where the formation of the N-channel MOS transistor is predetermined (in the peripheral circuit region 153). By means of the ion implantation or the like of a high concentration of arsenic using as a mask this photoresist film 147, the N⁺-type diffusion layer is formed in self-alignment with the field insulation film 102, (the gate electrode 112) and the insulation film spacer 127c on the peripheral circuit region 153. The junction depth of the N⁺-type diffusion layer 129 is, for example, about 200 nm. In such a process, the N-channel MOS transistor constituting the peripheral circuit is completed (see FIG. 9D).

Subsequently, in the same manner as a first embodiment described above, a third silicon oxide film 131 having a thickness of, for example, about 100 nm is formed on the overall surface by means of the APCVD. Furthermore, a BPSG film 132 having a thickness of, for example, about 200 nm is formed on the overall surface of the substrate by means of the APCVD. At this time, the highest position on the upper surface of the BPSG film 132 is a portion immediately on the word lines 111 while the lowest position on the upper surface thereof is a portion immediately on the field insulation film 102, and the NC-type diffusion layer 129 (in the peripheral circuit region 153) located adjacent to the boundary region 152. The maximum step on the upper surface of the BPSG film 132 is about 250 nm. This value is equal to the sum of the thickness of the word lines 111 and the thickness of the lamination layer insulation film formed by a lamination of the silicon nitride film 125 on the silicon oxide film 124 (see FIG. 9E).

Next, heat treatment is carried out in an atmosphere of nitrogen, for example, at 850° C. for about 10 minutes, and the BPSG film 132 is reflowed so that the BPSG film 133 is provided. By this reflow, the maximum step of the upper surface of the BPSG film 133 is decreased to about 190 nm (see FIG. 9F).

Next, the chemical amplification type and positive type photoresist film is formed on the surface of the BPSG film 133. An opening pattern is formed on this photoresist film focusing the upper surface of the photoresist film immediately on the word lines 111 (under the condition that the opening pattern width becomes mini-mum at this position)

by means of the stepper exposure using the KrF excimer laser. The anisotropic etching process is carried out with respect to the silicon oxide film using as a mask this photoresist film with the result that bit contact holes 135c reaching the N⁻-type source and drain region 114 and contact holes 136c reaching the LDD type source and drain region 130 or the like are formed. The bit contact holes 135c reaching the N⁻-type source and drain region 114 has a one side length of about 0.25 μm while the contact holes 136c has a one side length of about 0.3 μm.

When required, by means of the ion implantation of a high concentration of phosphorus, the N⁺-type diffusion layer is formed on the surface of the N⁻-type source and drain region 114 and the LDD-type source and drain region 130 in self-alignment with the bit contact holes 135c and contact holes 136c respectively. Furthermore, when required, an insulation film spacer having a thickness of about 20 nm is formed which covers the side of the bit contact holes 135c and the contact holes 136c. The effective contact sizes of the bit contact holes 135c and the contact holes 136c in this case are such that the one-side lengths thereof are set to about 0.26 μm and 0.46 μm respectively.

For example, the second conductive film having a thickness of, for example, 150 nm is formed on the overall surface of the substrate. The method for forming the second conductive film is preferably the LPCVD, and this conductive film comprises a high melting point metal film such as an N⁺-type polycrystal silicon film, a tungsten film or the like, a high melting point metal silicide film such as a tungsten silicide film or the like, and a lamination film thereof. A chemical amplification type and positive type photoresist film (not shown) covering the surface of the conductive film is formed. The main component of this photoresist film is, for example, tBOC-type polyhydroxystyrene (PBOCST). This is subjected to the stepper exposure using the KrF excimer laser with the result that the second photoresist film pattern is formed.

By means of the anisotropic etching process of the second conductive film using as a mask the second photoresist film pattern, the bit lines 137c, the wiring 138c or the like are formed. The bit lines 137c are connected to the plurality of cell transistors via the bit contact holes 135c and are connected at least to one of the N-channel MOS transistors constituting the peripheral circuit via the contact holes 136c. The wiring 138c is used for the connection between the N-channel MOS transistors constituting the peripheral circuit via the contact holes 136c. The bit lines 137c are used for the connection between the N-channel MOS transistors or the like constituting the peripheral circuit via the contact holes 136c. The bit lines 137c run at right angle with the word lines 111 via the interlayer insulation film and the silicon oxide film 124 (see FIGS. 10A and 10B).

According to a forth embodiment, in the same manner as a third embodiment, since the thickness of the insulation film spacer 127c directly covering the side of the gate electrode 112 of the MOS transistor constituting the peripheral circuit is t2+t3, the thickness of the lamination layer insulation film (formed by the lamination of the silicon nitride film 125 on the first silicon oxide film 124) directly covering the side and the upper surface of the word lines 111 is t2, and the thickness of the word lines 111 is t1, it is easy to establish a relation of t1+t2>DOF/2 and DOF/2>H>DOF/2−t3 wherein symbol H denotes the maximum step of the upper surface of the interlayer insulation film between the bit lines 137c and the word lines 111 with the result that it becomes easy to avoid the short circuit and the disconnection of the bit lines 137c without sacrificing the productivity.

After that (not shown), the second interlayer insulation film is formed on the overall surface of the substrate. After the node contact holes are formed which reach the other of the N-type source and drain region 114 through the second interlayer insulation film, the BPSG film 133 and the silicon oxide film 131 (and the gate insulation film 105), a storage node electrode connected to the cell transistor via the node contact holes is formed. Furthermore, the capacity insulation film, the cell plate electrode or the like are formed with the result that the DRAM according to the present invention is completed.

The present embodiment according to a third embodiment of the present invention has the effect which a second embodiment described above has.

Incidentally, also according to a fourth embodiment, the values including t1, t2 and t3 and each kind of constituent material are not limited to the values and material described above.

As has been described, according to the present invention, the thickness of the insulation film directly covering the upper surface of the word lines of the present invention is made thinner than the thickness of the insulation film spacer directly covering the side of the gate electrode of the peripheral circuit. As a consequence, it becomes easy to avoid the disconnection and the short circuit of the bit lines having a pattern width and the interval finer than the wavelength k of the exposure light without sacrificing the productivity.

What is claimed is:

1. A method of manufacturing a semiconductor memory in which:

bit lines are formed by photolithography of an exposure light having a wavelength of λ, and a depth of focus of DOF, and a line width of the bit lines excluding a connection portion with cell transistors and a minimum interval of the bit lines becomes shorter than λ respectively in the bit lines, and an accumulation capacity element is further provided above the bit lines, the method comprising the steps of:

forming a P-type region on a surface of a silicon substrate, forming grooves in a cell array region, a peripheral circuit region and a device separation region of a boundary region between the cell array region and the peripheral circuit region and filling in the grooves with a field insulation film, an upper surface of which is generally flush with the surface of the silicon substrate;

forming a gate insulation film by heat oxidation on the surface of the silicon substrate in the cell array region and the peripheral circuit region surrounded by the device separation region, forming a first conductive film having a first thickness (=t1) on an overall surface of the silicon substrate, and forming word lines and a gate electrode on the surface of the P-type region of the cell array region and the peripheral circuit region by the patterning of the first conductive film;

forming an N⁻-type source and drain region and an N⁻-type diffusion layer on the surface of the P-type region of the cell array region and the peripheral circuit region surrounded by the device separation region in self-alignment with the word lines and the gate electrode;

forming a first silicon oxide film having a second thickness (=t2) which is thicker than the DOF/2−t1 on the overall surface of the silicon substrate by low pressure chemical vapor deposition (LPCVD);

etching back the first silicon oxide film by an anisotropic dry etching process to set the thickness of the first silicon oxide film immediately on the word lines and the gate electrode to a third thickness (=t3);

etching back again the first silicon oxide film again by anisotropic dry etching using as a mask a first photoresist film pattern which covers the cell array region and the boundary region and which has an opening in the peripheral circuit region to retain and for an insulation film spacer comprising the first silicon oxide film on a side of the gate electrode;

forming an N$^+$-type diffusion layer on the surface of the P-type region of the peripheral circuit region by using as a mask the gate electrode and the insulation film spacer and forming an LDD-type source and drain region comprising the N$^+$-type diffusion layer and the N$^-$-type diffusion layer;

forming a second silicon oxide film on an overall surface of the substrate and forming a BPSG film on the overall surface of the silicon substrate by APCVD and reflowing the BPSG film so that the maximum step of an upper surface of the BPSG film becomes smaller than t1+t3 and DOF/2 and larger than DOF/2−(t2−t3) thereby forming an interlayer insulation film comprising the second silicon oxide film and the BPSG film;

forming on the interlayer insulation film bit contact holes and contact holes which reach respectively one of the N-type source and drain region and one of the LDD-type source and drain region;

forming a second conductive film on an overall surface of the silicon substrate, forming a positive-type photoresist film on the overall surface of the substrate, forming a second photoresist film pattern by focusing on an upper surface of the photoresist film immediately on the word lines and further performing exposure under the condition that a pattern width in this portion becomes maximum, forming bit lines by anisotropic dry etching using as a mask these photoresist film patterns, and simultaneously forming wiring on the peripheral circuit region; and forming a second interlayer insulation film on the overall surface of the substrate, forming a node contact hole which reaches the other of the N$^-$-type source and drain region through the second interlayer insulation film and the first interlayer insulation film and forming an accumulation capacity element connected to the other of the N$^-$-type source and drain region via the node contact hole.

2. The method according to claim 1, wherein the second photoresist film pattern is formed of a chemical amplification type photoresist film, and the second photoresist film patterns are formed by exposure to a KrF or ArF excimer laser.

3. A method of manufacturing a semiconductor memory in which:

bit lines are formed by photolithography of an exposure light having a wavelength of λ, and a depth of focus of DOF, and a line width of the bit lines excluding a connection portion with cell transistors and a minimum interval of the bit lines becomes shorter than λ respectively in the bit lines, and an accumulation capacity element connected to the other of the N$^-$-type source and drain region is further provided above the bit lines, the method comprising the steps of:

forming a P-type region on a surface of a silicon substrate, forming grooves in a cell array region, a peripheral circuit region and a device separation region of a boundary region between the cell array region and the peripheral circuit region, and filling in the grooves a field insulation film, an upper surface of which is generally flush with the surface of the silicon substrate;

forming a gate insulation film by heat oxidation on the surface of he silicon substrate in the cell array region and the peripheral circuit region surrounded by the device separation region, forming a first conductive film having a first thickness (=t1) on the overall surface of the substrate, and forming word lines and a gate electrode on the surface of the P-type region on the cell array region and the peripheral circuit region by the patterning of the first conductive film;

forming an N$^-$-type source and drain region and an N$^-$-type diffusion layer on the surface of the P-type region of the cell array region and the peripheral circuit region surrounded by the device separation region in self-alignment with the word lines and the gate electrode;

forming a first silicon oxide film having a second thickness which is thicker than DOF/2−t1 by a low pressure chemical vapor deposition;

etching back the first silicon oxide film by an anisotropic dry etching to set the thickness of the first silicon oxide film immediately on the word lines and the gate electrode to a third thickness (=t3);

forming a first photoresist film pattern and etching back again the first silicon oxide film again by anisotropic dry etching using as a mask the first photoresist film pattern which covers the cell array region and the boundary region and which has an opening in the peripheral circuit region to retain and form an insulation film spacer comprising the first silicon oxide film on a side of the gate electrode;

forming an N$^+$-type diffusion layer on the surface of the P-type region of the peripheral circuit region by using as a mask the gate electrode and the insulation film spacer and forming an LDD-type source and drain region comprising the N$^+$-type diffusion layer and the N$^-$-type diffusion layer;

forming a second silicon oxide film on an overall surface of the substrate and forming a BPSG film on the overall surface of the silicon substrate by APCVD and reflowing the BPSG film so that a maximum step of the upper surface of the BPSG film becomes smaller than t1+t2−t3 and DOF/2 and larger than DOF/2−t3 thereby forming an interlayer insulation film comprising the second silicon oxide film and the BPSG film;

forming on the interlayer insulation film bit contact holes and contact holes which reach respectively one of the N-type source and drain region and one of the LDD-type source and drain region; forming a second conductive film on an overall surface of the silicon substrate, forming a positive-type photoresist film on the overall surface of the substrate, forming a second photoresist film pattern by focusing on an upper surface of the photoresist film immediately on the word lines and performing exposure under a condition that a pattern width in this portion becomes maximum, and forming bit lines by anisotropic dry etching using as a mask these photoresist film patterns; and simultaneously forming wiring on the peripheral circuit region; and forming a second interlayer insulation film on the overall surface of the substrate, forming a node contact hole which reaches the other of the N$^-$-type source and drain region through the second interlayer insulation film and the first interlayer insulation film and forming an accumulation capacity element connected to the other of the N⁻-type source and drain region via the node contact hole.

4. The method according to claim 3, wherein the second photoresist film pattern is formed of a chemical amplification type photoresist film, and the second photoresist film is formed by exposure to a KrF or ArF excimer laser.

5. A method of manufacturing a semiconductor memory in which:

bit lines are formed by photolithography of an exposure light having a wavelength of $\lambda$, and a depth of focus of DOF, and a line width of the bit lines excluding the connection portion with cell transistors and a minimum interval of the bit lines becomes shorter than $\lambda$ respectively in the bit lines, and an accumulation capacity element connected to the other of the N⁻-type source and drain region is further provided above the bit lines, the method comprising the steps of:

forming a P-type region on a surface of a silicon substrate, forming grooves in a cell array region, a peripheral circuit region and a device separation region of the boundary region between the cell array region and the peripheral circuit region, and filling in the grooves a field insulation film, an upper surface of which is generally flush with the surface of the silicon substrate;

forming a gate insulation film by heat oxidation on the surface of the silicon substrate in the cell array region and the peripheral circuit region surrounded by the device separation region, forming a first conductive film having a first thickness (=t1) on the overall surface of the substrate, and forming word lines and a gate electrode on the surface of the P-type region on the cell array region and the peripheral circuit region by the patterning of the first conductive film;

forming an N⁻-type source and drain region and an N⁻-type diffusion layer on the surface of the P-type region of the cell array region and the peripheral circuit region surrounded by the device separation region in self-alignment with the word lines and the gate electrode;

forming a first silicon oxide film having a second thickness (=t2) and a silicon nitride film having a third thickness (-t3) subsequently on an overall surface of the silicon substrate by LPCVD under a condition of t1+t2+t3>DOF/2;

selectively etching the silicon nitride film by anisotropic dry etching to form a silicon nitride film spacer which covers the word lines and a side of the gate electrode respectively via the first silicon oxide film;

etching back the silicon nitride spacer and the first silicon oxide film using as a mask a first photoresist film pattern which covers the cell array region and the boundary region and which has an opening in the peripheral circuit region by the anisotropic dry etching process in which an etching rates with respect to the silicon oxide film and the silicon nitride film are generally equal thereby retaining and forming on the side of the gate electrode an insulation film spacer formed by a lamination of the silicon nitride film spacer on the first silicon oxide film;

forming an N⁺-type diffusion layer on the surface of the P-type region of the peripheral circuit region by using as a mask the gate electrode and the insulation film spacer, and forming an LDD-type source and drain region comprising the N⁺-type diffusion layer and the N⁻-type diffusion layer;

forming a second silicon oxide film on an overall surface of the substrate and forming a BPSG film on the overall surface of the silicon substrate by APCVD and reflowing the BPSG film so that a maximum step of an upper surface of the BPSG film becomes smaller than t1+t2 and DOF/2 and larger than DOF/2−t3, thereby forming an interlayer insulation film comprising the second silicon oxide film and the BPSG film;

forming on the interlayer insulation film a bit contact hole and a contact hole which reach respectively one of the N-type source and drain region and one of the LDD-type source and drain region;

forming a second conductive film on an overall surface of the silicon substrate, forming a positive-type photoresist film on the overall surface of the substrate, forming a second photoresist film pattern by focusing on an upper surface of the photoresist film immediately on the word lines and performing exposure under the condition that a pattern width in this portion becomes maximum, and forming bit lines by anisotropic dry etching using as a mask these photoresist film patterns; and simultaneously forming wiring on the peripheral circuit region; and forming a second interlayer insulation film on the overall surface of the substrate, forming a node contact hole which reaches the other of the N⁻-type source and drain region through the second interlayer insulation film and the first interlayer insulation film and forming an accumulation capacity element connected to the other of the N⁻-type source and drain region via the node contact hole.

6. The method according to claim 5, wherein the second photoresist film comprises a chemical amplification type photoresist film, and the formation of the second photoresist film pattern is carried out by exposure to a KrF or ArF excimer laser.

7. The method according to claim 5, wherein the anisotropic dry etching for forming the insulation film spacer is carried out with tetrafluoromethane ($CF_4$).

8. A method of manufacturing a semiconductor memory in which:

bit lines are formed by photolithography of an exposure light having a wavelength of $\lambda$, and a depth of focus of DOF, and a line width of the bit lines excluding a connection portion with cell transistors and a minimum interval of the bit lines becomes shorter than $\lambda$ respectively in the bit lines, and an accumulation capacity element connected to the other of the N⁻-type source and drain region is further provided above the bit lines, the method comprising the steps of:

forming a P-type region on a surface of a silicon substrate, forming grooves in a cell array region, a peripheral circuit region and a device separation region of a boundary region between the cell array region and the peripheral circuit region, and filling in the grooves a field insulation film, an upper surface of which is generally flush with the surface of the silicon substrate;

forming a gate insulation film by heat oxidation on the surface of the silicon substrate in the cell array region and the peripheral circuit region surrounded by the device separation region, forming a first conductive film having a first thickness (=t1) on the overall surface of the substrate, and forming word lines and a gate electrode on the surface of the P-type region on the cell array region and the peripheral circuit region by a patterning of the first conductive film;

forming an N⁻-type source and drain region and a N⁻-type diffusion layer on the surface of the P-type region of the cell array region and the peripheral circuit region surrounded by the device separation region in self-alignment with the word lines and the gate electrode;

forming a first silicon oxide film having a second thickness (=t2) and a silicon nitride film which is sufficiently thinner than the first silicon oxide film subsequently on the overall surface of the substrate by LPCVD;

selectively removing the silicon nitride film by an isotropic dry etching process by using as a mask a first photoresist film pattern which covers the cell array region and the boundary region and which has an opening in the peripheral circuit region;

forming a second silicon oxide film having a third thickness (=t3) on the overall surface of the substrate LPCVD under the condition of t1+t2+t3>DOF/2;

retaining and forming on a side of the word lines a silicon oxide film spacer comprising the second silicon oxide film and retaining and forming on side of the gate electrode an insulation film spacer comprising a lamination of the second silicon oxide film on the first silicon oxide film by the etch-back using an anisotropic dry etching process for selectively etching the silicon oxide film;

forming an N⁺-type diffusion layer on the surface of the P-type region of the peripheral circuit region by using as a mask the gate electrode and the insulation film spacer, and forming an LDD-type source and drain region comprising the N⁺-type diffusion layer and the N⁻-type diffusion layer;

forming a third silicon oxide film on the overall surface of the substrate, further forming a BPSG film on the overall surface of the substrate by APCVD and reflowing the BPSG film so that a maximum step of an upper surface of the BPSG film becomes smaller than t1+t2 and DOF/2 and larger than DOF/2−t3 thereby forming an interlayer insulation film comprising the second silicon oxide film and the BPSG film;

forming a bit contact hole and a contact hole which reaches one of the N-type source and drain region and one of the LDD-type source and drain region on the interlayer insulation film;

forming a second conductive film on an overall surface, forming a positive-type photoresist film on the overall surface of the substrate forming a second photoresist film pattern by focusing on an upper surface of the photoresist film immediately on the word lines and carrying out exposure under a condition that a pattern width at this portion becomes maximum and bit lines are formed by anisotropic dry etching using as a mask the photoresist film patterns and simultaneously forming wiring on the peripheral circuit region;

forming, a second interlayer insulation film on the overall surface of the substrate, forming an ode contact hole which reaches the other of the N⁻-type source and drain region through the second interlayer insulation film and the first interlayer insulation film and forming an accumulation capacity element connected to the other of the N⁻-type source and drain region via the node contact hole.

9. The method according to claim 8, wherein the second photoresist pattern is formed of a chemical amplification type photoresist film, and the second photoresist film pattern is formed by exposure to a KrF or ArF excimer laser.

10. The method according to claim 8, wherein a selective isotropic dry etching with respect to the silicon nitride film is carried out with sulphur hexaflouride ($SF_6$).

* * * * *

UNITED STATES PATENT AND TRADEMARK OFFICE
CERTIFICATE OF CORRECTION

PATENT NO. : 6,110,753
DATED : August 29, 2000
INVENTOR(S) : Ryoichi Nakamura

It is certified that error appears in the above-identified patent and that said Letters Patent is hereby corrected as shown below:

Column 3, line 46, delete "by"

Column 4, line 21, delete "line" insert --lines-- line 22, delete " "s" " insert --are--;

line 22, delete "line 237 is" insert --lines 237 are--.

Column 25, line 12 delete "ba" insert --b--

Column 28, line 47 delete "NC" insert --$N^+$--.

line 67, delete "mini-mum" insert --minimum--

Column 30, line 26, delete "K" insert --$\lambda$--.

Signed and Sealed this

Twenty-ninth Day of May, 2001

*Attest:*

NICHOLAS P. GODICI

*Attesting Officer*    *Acting Director of the United States Patent and Trademark Office*